US006331217B1

(12) United States Patent
Burke et al.

(10) Patent No.: US 6,331,217 B1
(45) Date of Patent: Dec. 18, 2001

(54) TURBINE BLADES MADE FROM MULTIPLE SINGLE CRYSTAL CAST SUPERALLOY SEGMENTS

(75) Inventors: Michael A. Burke, Pittsburgh; Paula D. Freyer, Cranberry Township, both of PA (US); Mohan A. Hebbar, Oviedo; Brij B. Seth, Maitland, both of FL (US); Gary W. Swartzbeck, North Huntingdon, PA (US); Thomas Walter Zagar, Winter Springs, FL (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 09/509,600

(22) Filed: Jul. 6, 2000

Related U.S. Application Data

(60) Provisional application No. 60/063,640, filed on Oct. 27, 1997.

(51) Int. Cl.[7] ................................ C22F 1/10; F01D 5/12
(52) U.S. Cl. .................... 148/522; 148/555; 148/562; 148/675; 148/410; 416/241 R
(58) Field of Search .................... 148/522, 555, 148/562, 675, 410, 428; 416/241 R

(56) References Cited

U.S. PATENT DOCUMENTS

| 1,829,179 | 10/1931 | Back . |
| 3,067,982 | 12/1962 | Wheeler, Jr. . |

(List continued on next page.)

OTHER PUBLICATIONS

Tuah–Poku, I. et al., "A Study of the Transient Liquid Phase Bonding Process Applied to a Ag/Cu/Ag Sandwich Joint," *Metallurgical Transactions*, vol. 19A, pp. 675–686, Mar. 1988.

Duvall, D.S. et al., "TLP Bonding: A New Method for Joining Heat Resistant Alloys," *Welding Journal*, vol. 53, 203–214, Apr. 1974.

Giamei, A.F. et al., "Energy Efficient Engine High–Pressure Turbine Single Crystal Vane and Blade Fabrication Technology Report," *U.S. Department of Commerce National Technical Information Service*, Jul. 1981.

Frasier, D.J. et al., "Process and Alloy Optimization for CMSX–4® Supperalloy Single Cystal Airfoils," *High Temperature Materials for Power Engineering*, pp. 1281–1300, 1990.

MacKay R.A. et al., "Microstructure–Property Relationships in Directionally Solidified Single–Crystal Nickel–Base Superalloys," *MiCon 86–Optimization of Processing Properties and Servce Performance through Microstructural Control, ASTM STP 979*, 1988.

Nakahashi, M. et al., "Transient Liquid Phase Bonding for Ni–base Superalloys Mar–M247 and IN939," *Materials Transactions*, vol. 33, pp. 60–65, 1992.

(List continued on next page.)

Primary Examiner—George Wyszomierski
(74) Attorney, Agent, or Firm—Eckert Seamans Cherin & Mellott, LLC

(57) ABSTRACT

Large gas turbine blades made from separate cast segments of superalloys are disclosed. The turbine blade is designed such that bond lines between adjacent segments are placed in low stress regions of the blade. The cast superalloy segments of the blades are aligned and fitted together with specified tolerances. The turbine blade segments are then joined by transient liquid phase bonding, followed by a controlled heat treatment which produces the desired microstructure in the bond region. The method allows for the production of large, high quality turbine blades by joining small, high quality cast superalloy sections, in comparison with prior attempts to cast large turbine blades as single pieces which have produced very low yields and high individual component costs.

20 Claims, 11 Drawing Sheets

U.S. PATENT DOCUMENTS

| | | |
|---|---|---|
| 3,342,455 | 9/1967 | Fleck et al. . |
| 3,536,121 | 10/1970 | Piearcey . |
| 3,753,794 | 8/1973 | Paulonis et al. . |
| 3,940,268 | 2/1976 | Catlin . |
| 3,981,344 | 9/1976 | Hayes et al. . |
| 4,059,217 | 11/1977 | Woodward . |
| 4,089,456 | 5/1978 | Toppen et al. . |
| 4,096,615 | 6/1978 | Cross . |
| 4,186,473 | 2/1980 | Cross et al. . |
| 4,311,433 | 1/1982 | Bratton et al. . |
| 4,364,160 | 12/1982 | Eiswerth et al. . |
| 4,376,004 | 3/1983 | Bratton et al. . |
| 4,417,381 | 11/1983 | Higginbotham . |
| 4,447,188 | 5/1984 | Davis et al. . |
| 4,475,980 | 10/1984 | Rhemer et al. . |
| 4,507,051 | 3/1985 | Lesgourgues et al. . |
| 4,529,452 | 7/1985 | Walker . |
| 4,538,331 | 9/1985 | Egan et al. . |
| 4,592,120 | 6/1986 | Egan et al. . |
| 4,611,752 | 9/1986 | Jahnke . |
| 4,614,296 | 9/1986 | Lesgourgues . |
| 4,637,448 | 1/1987 | Burke et al. . |
| 4,659,288 | 4/1987 | Clark et al. . |
| 4,700,881 | 10/1987 | Ryan . |
| 4,768,700 | 9/1988 | Chen . |
| 4,784,572 | 11/1988 | Novotny et al. . |
| 4,784,573 | 11/1988 | Ress, Jr. . |
| 4,796,343 | 1/1989 | Wing . |
| 4,817,858 | 4/1989 | Verpoort . |
| 4,869,645 | 9/1989 | Verpoort . |
| 4,921,405 | 5/1990 | Wilson . |
| 5,061,154 | 10/1991 | Kington . |
| 5,071,059 | 12/1991 | Heitman et al. . |
| 5,240,518 | 8/1993 | Wortman et al. . |
| 5,318,406 | 6/1994 | Bardes . |
| 5,358,029 | 10/1994 | Baveja et al. . |
| 5,419,039 | 5/1995 | Auxier et al. . |
| 5,503,532 | 4/1996 | Schilling . |
| 5,509,980 | 4/1996 | Lim . |
| 5,611,670 | 3/1997 | Yoshinari et al. . |
| 5,621,968 | 4/1997 | Kikkawa et al. . |

OTHER PUBLICATIONS

Zheng, Y. et al., "Microstructure of Ni–10Co–8Cr–4W–13Zr Alloy and its Bonding Behaviour for Single–Crystal Nickel–base Superalloys," *Journal of Materials Science*, vol. 28, pp. 823–829, 1993.

Noebe, R. D. et al., "Joining of NiAl to Ni–Base Superalloys," *Paper 29*, pp. 1–12.

As-Cast/Bond/Solution + Precipitation

TURBINE BLADES MADE FROM MULTIPLE SINGLE CRYSTAL CAST SUPERALLOY SEGMENTS

CROSS REFERENCE TO RELATED APPLICATION

This application claims the benefit of U.S. Provisional Application Serial No. 60/063,640 filed Oct. 27, 1997.

GOVERNMENT CONTRACT

This invention was made with Government support under Contract No. 70NANB5H 1131 awarded by the United States Department of Commerce. The Government has certain rights in this invention.

FIELD OF THE INVENTION

The present invention relates to power generation combustion gas turbines, and more particularly relates to blades for such turbines made from multiple segments of cast superalloys.

BACKGROUND INFORMATION

State-of-the-art blades and vanes that are employed in modern, high efficiency power generation combustion turbine engines rely on high quality materials such as single crystal alloys and precise control of the part's internal and external dimensions. Because of the large size of these parts, cost-effective manufacturing is being pursued by several routes.

Land-based gas turbines, such as the advanced turbine system (ATS) which is under development, require cost-effective high performance components fabricated from advanced materials. First and second row turbine blades and vanes include complex internal and external geometries, and should be fabricated from defect-free materials. Although components with such features have been developed for aircraft engines, the larger size of power generation turbine components provides a crucial challenge. To date, casting trials have been unable to produce defect-free large components in any significant yields.

An alternative manufacturing approach would be to cast defect-free smaller subcomponents and to subsequently join them using a high quality bonding process. Currently, however, the required bonding technology for advanced superalloys, including single crystal materials such as CMSX-4 that are targeted for use in ATS-class engines, is not available.

SUMMARY OF THE INVENTION

Hot section gas turbine blades are fabricated from single crystal superalloy castings by bonding high quality cast sections or parts. The present method allows the production of large, high quality turbine blades by joining small, high quality sections, in comparison with prior attempts to cast turbine blades as single pieces which have produced very low yields with concomitant high individual component costs.

The present invention provides high yield production of large sized single crystal components for gas turbines. The method brings the costs of turbine blades into a regime that is affordable for commercial implementation. It also allows for the simultaneous attainment of precise parts profile and optimum material quality and performance, which cannot be accomplished with conventional casting of single crystal materials. By eliminating the casting core the present process provides for control of internal component geometry and features. Furthermore, by allowing access to the internal cooling passages during production, the capability for precise quality control of internal cooling features and wall dimensions is provided. The existence of internal grain structure and defects may also be determined. The invention provides more precisely controlled single crystal turbine blades at greatly reduced costs.

The blade is designed to allow the placement of the bond lines in low stress regions of the blade. The parts of the blade may be cast with specifically incorporated excess stock to provide for improved fit up for bonding. Deformation methods may be used to shape parts for profile and fit up. The turbine blade parts may be prepared to very precise fit up of the order of 0.0025 cm (0.001 inch) by machining processes such as co-EDM or the like. The bond gaps between the parts of the blade are then filled by foil or paste. Bonding foils and thermal processes are selected in order to provide high quality and strength bond joints. In one embodiment, single crystal sections may be joined to other single crystal sections. In another embodiment, single crystal sections may be joined to polycrystalline sections, including directionally solidified sections, to provide for the fabrication of cost effective hybrid blades.

A turbine blade design is sectioned along low stress regions into two or more pieces. In one embodiment, sectioning along a single surface that is approximately along the blade camber-line allows for the efficient joining of high quality castings to produce essentially defect-free blades of single crystal cast superalloys that are not capable of being conventionally produced in high yield without defects. In another embodiment, a blade design is sectioned into four pieces by sectioning along two further surfaces within the root section in addition to the original section of a single surface that is approximately along the blade airfoil camber-line. Thus, the four pieces are defined by further sectioning of the two original sections into two more sections. These extra two sections are preferably located in the root of the blade. They are provided over low stress surfaces, and are contoured to be intermediate between the surface contour of the outer surface of the blade root and the inner bonding surface contour. Subsequently casting and joining the multiple pieces into a single structure using transient liquid phase bonding allows for the efficient joining of high quality castings to produce essentially defect-free blades that are capable of performing at very high temperatures.

In a further embodiment, the airfoil section of the turbine blade is cast as a single crystal alloy, and the outer portions of the root are cast as a polycrystalline alloy. High quality individual pieces are cast in high yield and are subsequently joined by a bonding process such as transient liquid phase bonding to produce essentially defect-free, high quality turbine blades with a cost effective yield.

By reducing the section size of the castings, improved quality can be induced in the finished part, i.e., the production of grain boundaries, slivers and freckles may be reduced as the section size of the casting is reduced. Moreover, because the cast section can be selected to be a solid section, casting problems associated with casting around relatively sharp features of internal cores can be avoided. By using these approaches to reduce the tendency of producing defective castings, casting yields on the order of 80 to 90 percent may be possible.

The present method based upon the assembly of subcomponent segments of the blade structure incorporates low vulnerability bond planes into subcomponents that are designed to meet overall thermal, aerodynamic and mechanical needs. This segmentation divides the component into smaller segments that can be easily cast, that are suitable for easy assembly, and that position the bonding plane(s) in minimally stressed locations. The design segmentation process preferably identifies continuous slowly curving surfaces that will not be subject to significant loading across the bond plane. Eliminating sharp curvatures and intruding and protruding features from the surface of the subcomponents not only enhances casting yields, but also facilitates the application of the bonding medium and the fixturing of the subcomponents during bonding.

The preferred transient liquid phase bonding process provides for bonding of large blades of advanced single crystal alloys. The bond foil chemistry can be tailored to provide continuous structures across bond regions, even in single crystal structures, provided that post bonding thermal processing provides the desired $\gamma/\gamma'$ structure in the bond region as well as in the base metal. In addition to matching the microstructure in the bond region with the microstructure of the base material, the bond foil is selected such that it is compatible with the heat treatment process used for the base material.

Computer aided design coupled with finite element modeling may be used to facilitate the development and mechanical analysis of segmented subcomponents. These techniques permit the definition of the blade geometry with segmentation surfaces dividing the solid model into distinct domains. Starting from the original blade, segmentation proceeds by selecting potential segmentation surfaces and assessing them quantitatively from the point of view of the anticipated loads across the surface. The surfaces are then considered qualitatively from the point of view of providing smooth continuous surfaces to facilitate casting and bonding. The selected surfaces(s) can then be modified to eliminate features such as sharp corners that will impair the casting quality and inhibit bonding. The modified surface can then be analyzed using finite element modeling to reassess the potential loads across the bond line.

Current blade design requirements include high cycle fatigue, low cycle fatigue, creep, plasticity, and thermomechanical fatigue. The finite element modeling analyses of the potential bond surface indicate whether the mechanical properties of the bonded metal can meet these requirements. Effectively, the bond region properties must surpass those defined by the material requirements. Even though the present bonding process preferably targets 90 percent of the base metal performance, because the resulting material properties may be reduced slightly at the bond, the bond surface is placed in a location where the operating stresses are minimized.

An aspect of the present invention is to provide a method of making a single crystal-containing turbine blade for a land based gas turbine. The method includes the steps of selecting a single crystal superalloy for forming the turbine blade, selecting a plurality of segments of the turbine blade to be formed by a plurality of individual castings of the superalloy wherein the location of the segments are selected to place joints between adjacent segments at locations of reduced stress, forming the segments by casting the superalloy in a plurality of molds, and joining the segments.

Another aspect of the present invention is to provide a turbine blade for a land based gas turbine comprising multiple segments of a cast superalloy. The segments are designed such that joints between the segments are located in areas of reduced stress.

These and other aspects of the present invention will be more apparent from the following description.

DETAILED DESCRIPTION

Figure 1:
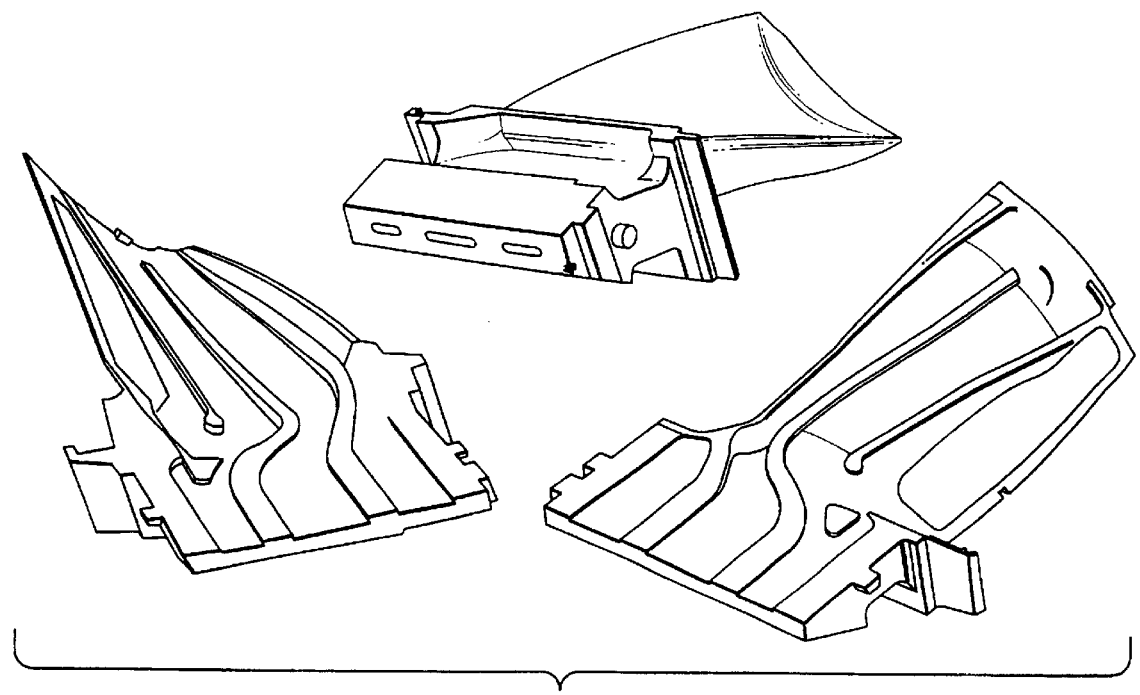
FIG. 1 is an isometric view of sectioned turbine blade halves and a bonded turbine blade in accordance with an embodiment of the present invention.

In accordance with the present invention, high yield production of single crystal superalloy turbine blades reduces the cost of single crystal blades for turbines. Currently less than 20 percent yield of blades as single castings is forecast for large, land based turbine blades, with the primary difficulty being the thickness of the casting. Reducing the thickness of the castings to below about 2 or 2.5 cm (about 0.75 or 1 inch) reduces defects and increases yields. The casting yield for half sections of blades should be on the order of 90 percent because of their reduced thickness. Bonding yields should also be about 90 percent. Thus, production yields of the bonded blades of the present invention may be about 80 percent or greater, compared to the projected 20 percent yield for single piece castings.

As used herein, the term "turbine blade" means a component of a land based gas turbine, including rotating blades and stationary vanes of such turbines. Rotating blades typically comprise an airfoil portion and a root portion including a platform. Stationary vanes typically comprise a central airfoil portion and two shroud portions which can be considered to be equivalent to the root portions of the rotating blades. The turbine blades are relatively large, preferably having a total length of at least about 12 inches, an airfoil chord of at least about 4 inches, and an airfoil thickness of at least about 5/16 inch. For rotating blades, the minimum length of the airfoil portion of the blade is preferably at least about 7 inches, while the minimum length of the root portion of the blade is at least about 5 inches. The root portion of such rotating blades preferably has a width of at least about 3 inches. The present turbine blades typically have a total length of about 18 inches, with the airfoil portion having a length of about 11 inches and the root portion having a length of about 7 inches. The chord of the airfoil portion is typically about 6 inches, while the thickness of the airfoil portion is typically about 1 inch. The root portion has a typical width of about 4 or 5 inches. For rotating blades, the airfoil portion accounts for approximately 20 percent of the total weight of the blade, while the root portion accounts for approximately 80 percent of the total weight. The present turbine blades preferably weigh more than 10 pounds, typically from about 20 to about 30 pounds. This is in comparison with aircraft turbine blades which typically weigh about 2 pounds and have substantially smaller dimensions.

In accordance with the present invention, a gas turbine blade that is usually cast as a single piece without joint regions can be cast as two or more piece, and subsequently joined if the joint surfaces are located along regions of low expected stress, and if the joint plane does not consist of any sharp angular protrusions or intrusions. One region of low expected stress lies along the approximate mid plane or camber-line of the blade airfoil. This camber-line surface is then extended into the root of the blade to provide complete sectioning of the blade. Subsequently, bonding across this surface using a high quality bonding process such as transient liquid phase bonding provides a high integrity bond in a region that is expected to experience only minimum stresses in service.

The selected surface based upon the camber-line approach is generally a plane of very low transverse stress during operation. The actual bonding surface can be selected to be very close to this camber-line surface since the stresses within the blade vary relatively gradually in this region. The bonding surface should avoid sharp intrusions and extrusions across the bonding plane since these will cause stress concentrations across the bond plane in service. The preferred way to combine the two criteria of being close to the camber-line plane while avoiding extraneous intrusions and extrusions is to start with the geometric section based upon the camber-line and to increase the radius of curvature of any intrusions and extrusions that appear on the section. This modified sectioning plane can then be analyzed using finite element analysis to determine that the stresses at all points are well below the performance limits of the material. Note that complete elimination of bond surface intrusion and extrusion regions is not required, and the existence of intruding and extruding regions may provide a degree of mechanical interlocking which will enhance the mechanical properties of the bonded blade, particularly under the action of the centrifugal stresses that will be generated by the rotation of the turbine.

The center line location defines the initial primary mating surface for the blade segments. The break through to the external wall surfaces of the leading edge and trailing edge of the airfoil is then modified based on geometric considerations. The leading edge wall break through is located by the apex of the leading edge radius, which is typically the one piece casting wax pattern core die split line. At the trailing edge, this same approach is followed, with the trailing edge radius apex defining the location of the mating surface. After this modification of the proposed segmentation, the expected design stresses across the new bond plane are reanalyzed using the finite element model and compared to the expected properties of the bonded metal.

In accordance with a further embodiment of the present invention, separating the airfoil from the platform and root portion permits casting the airfoil as a very high precision structure under very stringent conditions while the platform and root could be cast under different conditions. By reducing the lengths and thicknesses of the individual castings, casting yield may be improved. In this configuration, the continuation of the airfoil into the platform follows the pattern of the bottom of the airfoil-platform fillet radius and extends at least deep enough into the platform so that the local radial stresses drop below the target levels of the bonded material properties. This occurs at a depth equal to the airfoil wall thickness where the stresses are quite low and uniform across the section. At this location, the service temperatures also drop several hundred degrees below the airfoil temperatures.

The remaining segmentation of the blade parts is the paired splitting of the geometry of the platform and root shank areas. This segmentation primarily reduces the section size of the castings in order to further enhance casting yield.

The remaining root sections may be split into approximately equal thickness portions. This split may produce a continuously curved surface that is essentially curved in one direction. Stresses and temperatures are relatively low across this plane.

By selecting the bonding surfaces where the required strength is, for example, less than about 80 percent of the parent metal, all design criteria may be met. Because the bonding process does not change modulus and the final blade geometry is the same for the bonded or single piece casting, no frequency change is expected. The bonding surfaces are specifically selected away from those locations where thermo-mechanical fatigue or low cycle fatigue may approach the limits. Notably, at the bond areas, the thermo-mechanical fatigue and low cycle fatigue life will be exceeded even with a significant reduction in properties. The steady and vibratory stress contributions for the various modes are parallel rather than across the bonding planes or are at very low levels.

FIG. 1 shows how the segmentation scheme produces two blade halves that are effectively split down the middle of a conventional cored blade. In the root section the mating surfaces exhibit relatively gentle curves that accommodate the transition of the bond surface from the camber-line of the blade to the central plane of the root section.

Figure 2:
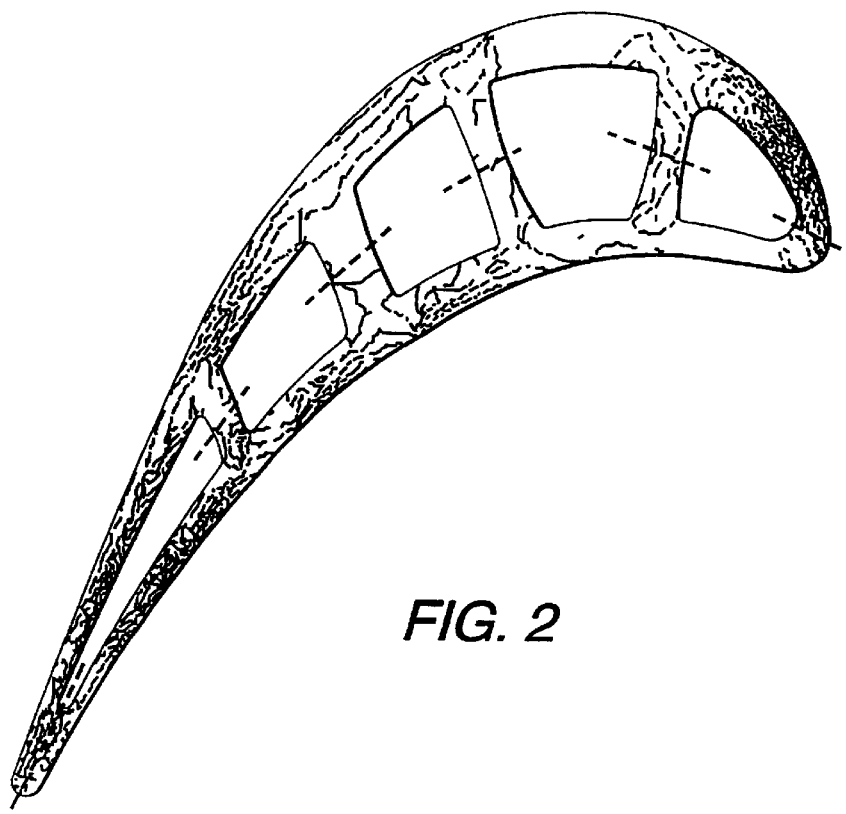
FIG. 2 is a stress contour plot from a cross-section of a turbine blade airfoil.

FIG. 2 shows a contoured stress plot of a finite element analysis of a section of the blade airfoil demonstrating that the expected stresses are well below the expected performance capabilities of the blade material.

Selection of the bond plane for a single crystal superalloy such as CMSX-4 is based upon the fact that the present transient liquid phase bonding process can generate approximately 80 or 90 percent of the expected base metal performance in the bond region. Compare this to the needed performance/strength, as determined by finite element analysis, which shows that across the selected bond surface the requirement is less than 20 percent of the base metal properties.

The controlling cross-section of a single crystal blade may be, for example, approximately 102 mm (4 inches) thick. By designing the blade in multiple parts, this cross section can be reduced to as little as approximately 25 mm (1 inch) or less at its widest location. For most of the height of the blade, the casting thickness may be less than approximately 13 mm (0.5 inch). An additional reduction in section width, for instance, from approximately 13 mm (0.5 inch) to 6 mm (0.25 inch), may further improve the casting quality and yield.

In another embodiment, the root sections of the turbine blade can be cast as two pieces. This avoids low casting yields associated with thick root sections which have high levels of defects. The yield for the root sections generally increases as the casting section size decreases. The resultant high yield production of single crystal blades reduces the cost of the turbine blades.

In this embodiment, a gas turbine blade that is usually cast as a single piece can be cast as four pieces which are subsequently joined at their smoothly varying bonding surfaces. Initial sectioning of the airfoil section along the camber-line may be performed as described previously. Each of these segments is then further subsectioned through the root of the blade. The surfaces produced by this sectioning lie about half way between the outer surface of the casting, which is essentially a series of plane sections, and the inner bonding surface which is defined by the previous segmentation.

This surface should be a surface that is exposed to a low load during service, and should also not contain sharp intrusions or extrusions. Because the inner/original bonding surface is constrained to have minimal surface contours, the new bonding surfaces are constrained to have intruding and extruding portions that have increased radii of curvature. Therefore, they present much lower stress concentrations than even those presented in the initial sectioning of the blade. Furthermore, because of the thick cross-section of the root and the relatively low temperatures to which the root is exposed, the stresses across these secondary bond lines are relatively low.

The modified sectioning plane may be analyzed using finite element analysis to determine that the stresses are at all points below the performance limits of the material. Complete elimination of bond surface intrusions and extrusion regions is not required. Some degree of mechanical interlocking between the external root sections and the internal root/airfoil sections is desirable. Such interlocks are effectively produced by the criterion to place the secondary bond surfaces approximately mid way between the external root surface and the internal/primary bond plane. Finally, in order to avoid sharp transions in sections at the root/air foil region, the inner cast segments of the airfoil may be slightly flared as they enter the root section of the blade, and the outer sections may be hollowed in order to accommodate this transition. A degree of mechanical interlocking is thus provided that is beneficial to mechanical integrity under centrifugal loading.

Figure 3:
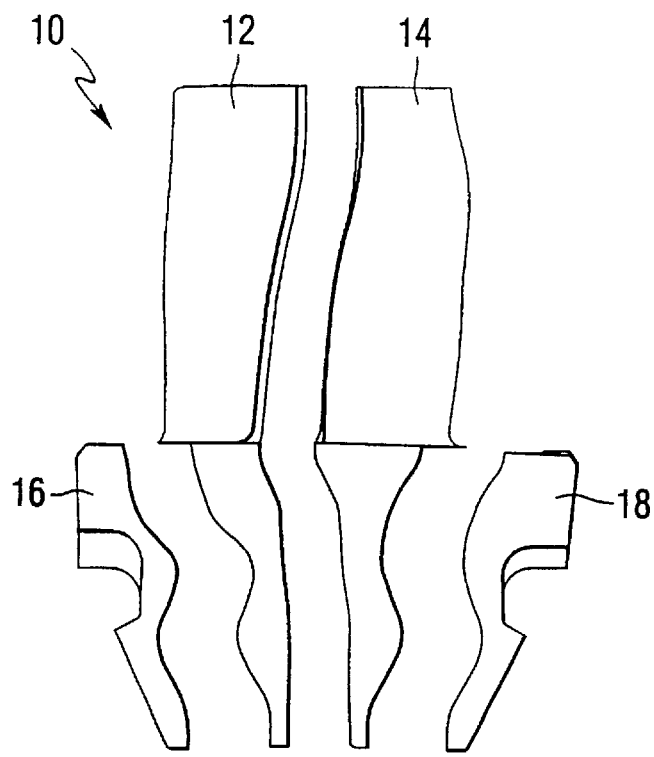
FIG. 3 is a side view of four turbine blade segmented parts in accordance with an embodiment of the present invention.

FIG. 3 illustrates a turbine blade 10 comprising four segments 12, 14, 16 and 18.

Figure 4:
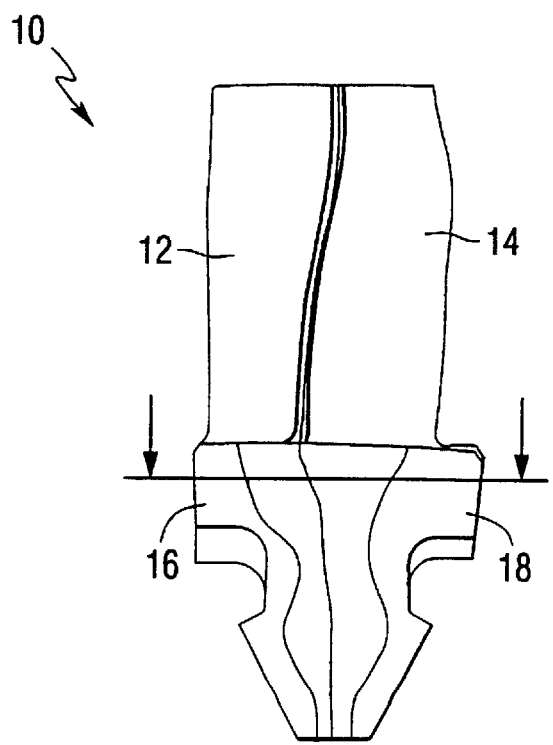
FIG. 4 is a side view of an assembled turbine blade made from separate segments as shown in FIG. 3.

FIG. 4 illustrates the turbine blade 10 with the four turbine blade segments 12, 14, 16 and 18 in assembled form.

Figure 4A:
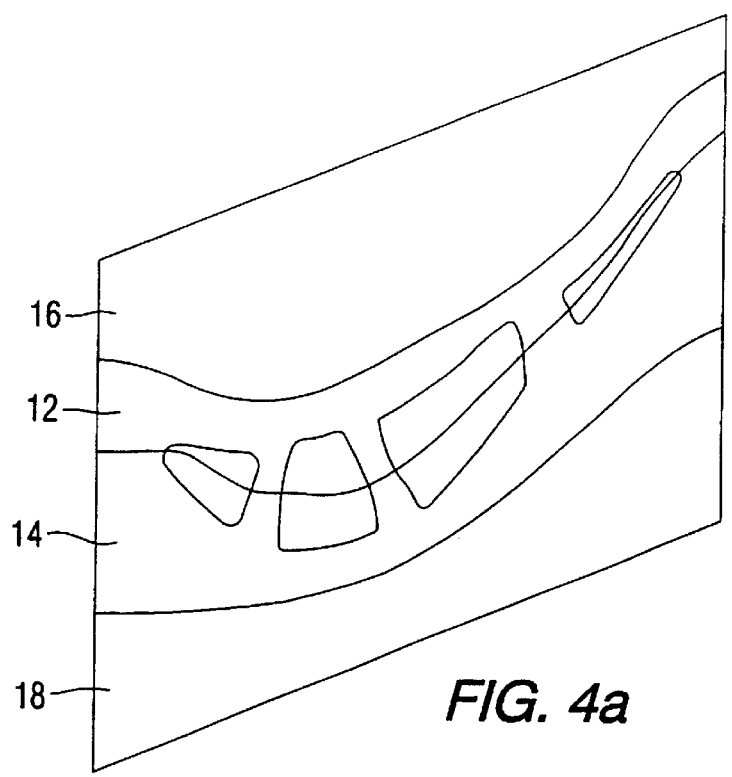
FIG. 4a is a cross-sectional view through a section of the multi-segment turbine blade of FIG. 4.

FIG. 4a is a cross-sectional view taken through the platform/root of the multi-segment turbine blade 10 of FIG. 4, showing cross sections of the assembled turbine blade parts 12, 14, 16 and 18.

Figure 5:
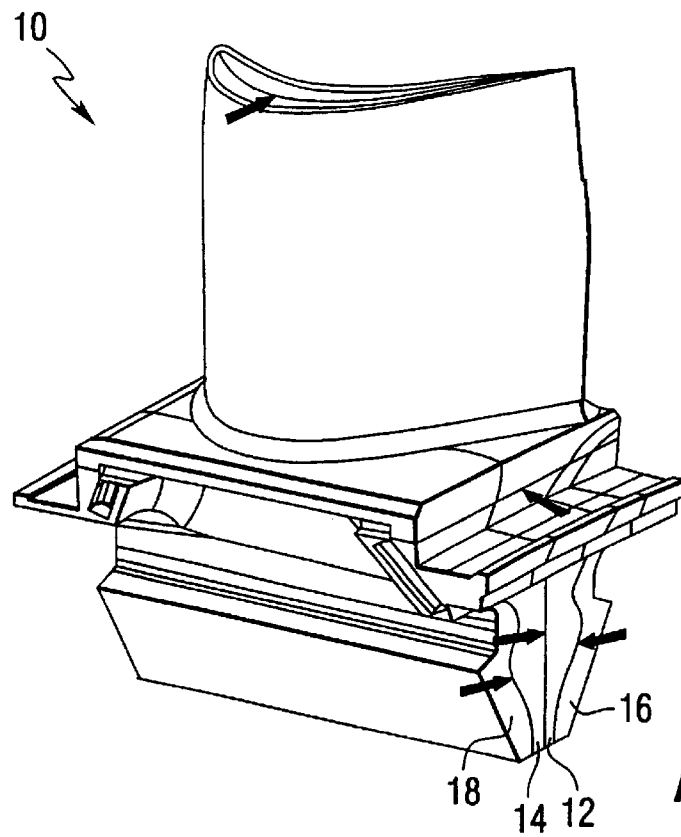
FIG. 5 is an isometric view of the assembled turbine blade of FIG. 4.

FIG. 5 is an isometric view of the assembled four piece blade design comprising the four segments 12, 14, 16 and 18. In this embodiment, no trans-bonding surface stresses were identified that were in excess of 20 percent of the performance capabilities of the alloy, e.g., CMSX-4.

Figure 6:
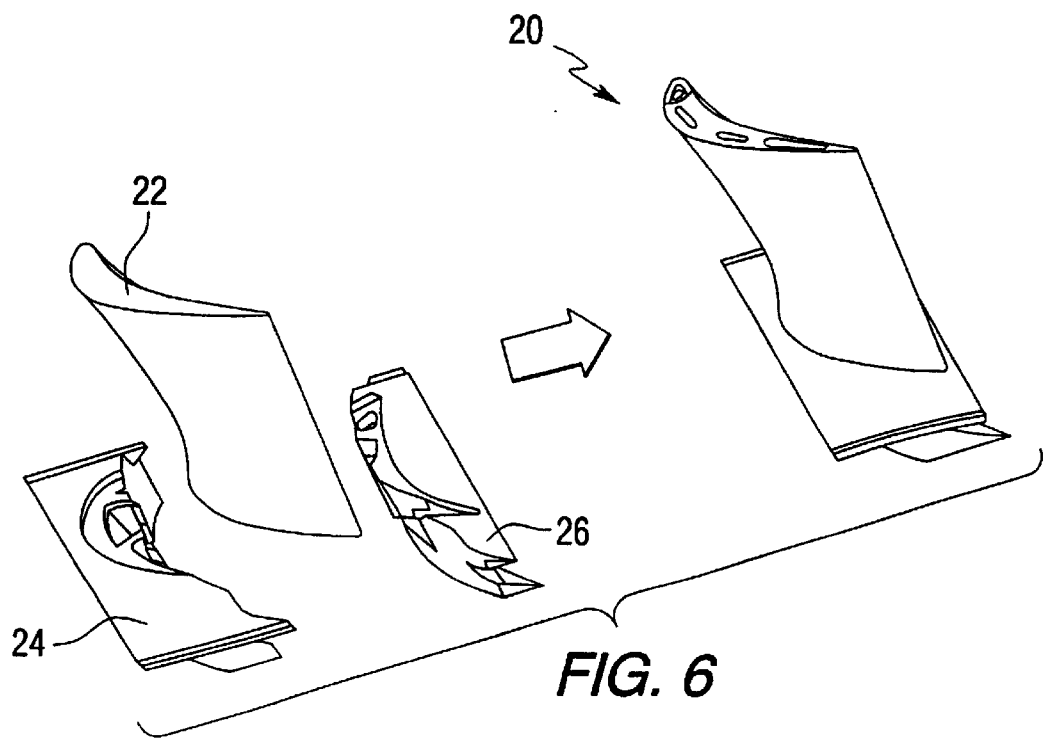
FIG. 6 is an isometric view showing the assembly of a multiple segment turbine blade in accordance with an embodiment of the present invention.

As a further refinement of this method the airfoil sections can be reduced in length so that they do not extend the full length of the root but only to a depth that allows adequate adhesion between the root sections and the airfoil sections. Alternatively, because of the thin section of the airfoil, it may be possible to cast the airfoil section as a single piece, thereby avoiding the need to join two airfoil halves. While these two features may be incorporated individually. FIG. 6 shows how they can be incorporated simultaneously to reduce the mass of the airfoil casting and to reduce bonding processing. In FIG. 6, a turbine blade 20 is assembled by joining three separate segments 22, 24 and 26.

In some applications, single crystal performance is only required in the airfoil section of the turbine blades. The root sections, which comprise most of the mass of the blades, are not exposed to the high temperatures and stresses that require single crystal materials. In addition to improving the quality and yield of blades with single crystal airfoils, the fabrication of blades with polycrystalline root sections greatly reduces the cost of the blades due to the lower cost of the polycrystalline portions of the blade. This embodiment may offer substantial savings over turbine blades made entirely of single crystals.

In this embodiment, a gas turbine blade can be cast as four pieces and then joined to produce a complete blade comprising at least one single crystal section and at least one polycrystalline section. The external root sections of the fabricated blade may comprise a polycrystalline superalloy, while the air foil section or sections may comprise a single crystal cast superalloy. The sectioning is performed as described previously. However, instead of all of the cast segments being cast from a single crystal alloy, the outer sections of the root are cast from a lower cost polycrystalline alloy that is compatible with the single crystal and with the bonding medium and heat treatment process to be employed.

In this embodiment, the two polycrystalline segments extend from the base of the airfoil to the end of the root of the blade. In order for the polycrystalline material to survive the bonding cycle, all of the bonds should be made at temperatures compatible with the polycrystalline material heat treatment cycle and temperature capability. Alternatively, the single crystal material may be bonded first at a higher temperature, and then the polycrystalline material may subsequently bonded at a lower temperature.

Since the cost driven objective is to decrease the amount of single crystal material in the root section, the airfoil section may be shortened so that it only extends a small distance into the root section. The polycrystalline root sections are adjusted to take the place of the material that has been displaced from the single crystal sections. It is also possible to cast the airfoil as a single section and avoid the need to bond two single crystal segments together, i.e., a three-piece construction.

In selecting materials that are capable of being joined together, the microstructural compatibility as well as heat treatment cycle compatibility of the materials should be considered. The bonding medium, usually a foil, is selected to provide a transient depression of the local melting temperature and to control bond region chemistry after solidification. The thermal or heat treatment cycle is selected to provide bonding and to generate suitable microstructures in the bulk alloys as well as in the bond zone. Because single crystal and polycrystalline alloys are heat treated and bonded at different temperatures, with the single crystal temperatures being generally higher than their polycrystalline equivalents, the thermal processes to bond single crystal and polycrystalline segments must be carefully selected in order to generate optimized structures in the single crystal and polycrystalline segments.

The objective of using a high quality bonding process such as transient liquid phase bonding is normally to produce essentially the identical chemistry and microstructure in the bond zone that exist in the bulk of the metal segments. This is generally achieved by matching the bond foil chemistry to the base metal chemistry, taking into account the preferential segregation that will occur during dissolution and resolidification. However, elements such as Ti and Al should be reduced in the bond foil compared to the base metal since these elements will be leached from the base metal and will tend to segregate to the center of the bond line after solidification. Since polycrystalline and single crystal alloys have different chemical compositions (see Table 1) identical matching of the bond foil composition to each side of a single crystal-to-polycrystal bond joint may not be possible. However, since some sets of alloys exhibit very similar compositions and volume fractions of gamma prime, it is possible to select polycrystalline and single crystal alloys of similar composition to be bonded, and to match their compositions with a bond foil that is used to bond either of the individual alloys.

Table 1 shows the composition of several single crystal and polycrystalline alloys. From this table it can be observed that several sets of single crystal alloys are compositionally close to some polycrystalline alloys, e.g. CMSX-4 and CM186, PWA1480 and MarM247, SC-16 and IN738. In fact, CMSX-4 and CM247 are sufficiently close in chemistry and structure to allow the production of good bonds using the transient liquid phase bonding process. This is because the effective difference in these alloys is the rhenium content, which does not readily diffuse in the solid and liquid states. Moreover, a gradient of rhenium across the bond zone provides a gradual transition in structure and properties that is not harmful to the performance of the bond joint.

TABLE 1

Single Crystal and Polycrystalline Turbine Blade Alloys (Weight Percent)

| Alloy | Ni | Cr | Co | Al | Ti | Nb | Mo | Ta | W | Re | Hf | Zr | B | C | Vol. % γ' |
|---|---|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — | — | 62 |
| PWA1484 | bal | 5 | 10 | 5.6 | 1 | — | — | 8.7 | 6 | 3 | 0.1 | — | — | — | 64 |
| PWA1480 | bal | 10 | 5 | 5 | 1.5 | — | — | 12 | 4 | — | — | — | — | — | 63 |
| SC-16 | bal | 16 | — | 3.5 | 3.5 | — | 3 | 3.5 | — | — | — | — | — | — | 41 |
| CMSX-11 | bal | 12.5 | 7 | 3.4 | 4.2 | 0.1 | 0.5 | 5 | 5 | — | 0.04 | — | — | — | ~45 |
| CM247 | bal | 8.1 | 9.2 | 5.6 | 0.7 | — | 0.5 | 3.2 | 9.5 | — | 1.4 | 0.015 | 0.015 | 0.07 | 62 |
| MarM002 | bal | 9 | 10 | 4.7 | 1.7 | 1 | — | — | 12.5 | — | — | — | — | — | 57 |
| MarM002 + Hf | bal | 9 | 10 | 5 | 2 | 1 | — | — | 12.5 | — | 1.8 | 0.06 | 0.02 | 0.14 | 58 |
| MarM246 | Bal | 9 | 10 | 5.5 | 1.5 | — | 2.5 | 1.5 | 10 | — | — | 0.06 | 0.015 | 0.15 | 65 |
| CM186 | bal | — | — | — | — | — | — | — | — | — | — | — | — | — | — |
| IN792 | bal | 12.4 | 9 | 4.5 | 4.5 | — | 1.8 | 3.9 | 3.9 | — | 1 | 0.02 | 0.015 | 0.08 | 45 |
| IN738 | bal | 16 | 8.5 | 3.4 | 3.4 | 0.9 | 1.75 | 1.75 | 2.6 | — | — | 0.1 | 0.01 | 0.11 | 37 |

Table 2 shows exemplary bonding alloys that can be applied to bond the sets of single crystal and polycrystalline alloys. Adequate alloy matching of aluminum-rich single crystals can be obtained by bonding using Ni-Flex type alloys. These foils can also be used to bond the polycrystalline alloys of this type (e.g., CM247, MarM247 and MarM002). Thus, these bond foils can be used to bond CMSX-4 type single crystal alloys to the similar class of polycrystalline alloys, e.g., CM247. Conversely, to bond the chromium rich materials, e.g., single crystal SC-16 type to IN738 type polycrystalline alloys, a foil of the type of MFB80/80A or the like is preferred.

TABLE 2

Bond Foil Chemistries (Weight Percent)

| Foil Type | Ni | Cr | Co | W | Ta | Mo | Fe | Hf | Al | Ti | B | C | Si |
|---|---|---|---|---|---|---|---|---|---|---|---|---|---|
| Ni-Flex 110 1.3B | bal | 10.0 | 5.0 | 4.0 | 4.0 | — | — | — | 2.0 | — | 1.3 | — | — |
| Ni-Flex 110 1.7B | bal | 10.0 | 5.0 | 4.0 | 4.0 | — | — | — | 2.0 | — | 1.7 | — | — |
| Ni-Flex 110 2.5B | bal | 10.0 | 5.0 | 4.0 | 4.0 | — | — | — | 2.0 | — | 2.5 | — | — |
| Ni-Flex 115 3.0B | bal | 9.0 | 8.0 | 4.0 | 4.0 | — | — | 1.0 | 2.0 | — | 3.0 | — | — |
| Ni-Flex 120 1.7B | bal | 10.0 | 5.0 | 5.0 | 3.0 | — | — | — | — | 1.0 | 1.5 | — | — |
| Ni-Flex 120 1.9B | bal | 10.0 | 5.0 | 5.0 | 3.0 | — | — | — | — | 1.0 | 1.7 | — | — |
| Ni-Flex 121 2.4B | bal | 10.0 | 10.0 | 5.0 | — | — | — | — | — | — | 2.4 | — | — |
| Ni-Flex 121 3.0B | bal | 10.0 | 10.0 | 5.0 | — | — | — | — | — | — | 3.0 | — | — |
| MBF20/20A | bal | 7.0 | — | — | — | — | 3 | — | — | — | 3.2 | 0.06 | 4.5 |
| MBF80/80A | bal | 15.2 | — | — | — | — | — | — | — | — | 4 | 0.06 | — |

As an example of bonding a single crystal alloy to a polycrystalline alloy, single crystal CMSX-4 may be bonded to polycrystalline CM247 alloy. A preferred bonding process is: mechanically polished surface to 0.05 micron finish; Ni-Flex 110 1.3B foil; 2,250° F. bond temperature; and bond time 4 hours.

Figure 7:
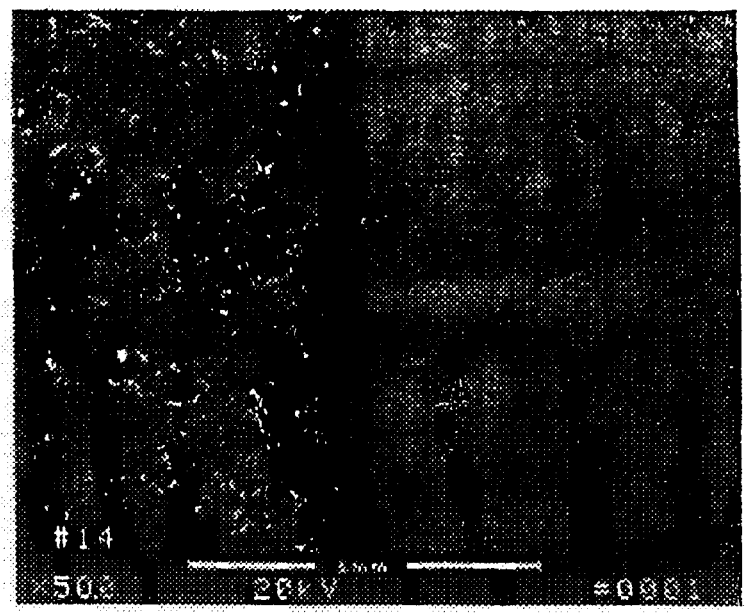
FIG. 7 is a photomicrograph showing the microstructure of a single crystal superalloy to polycrystalline superalloy bond in accordance with an embodiment of the present invention.

FIG. 7 shows the structure of the bond line at low magnification.

Figure 8:
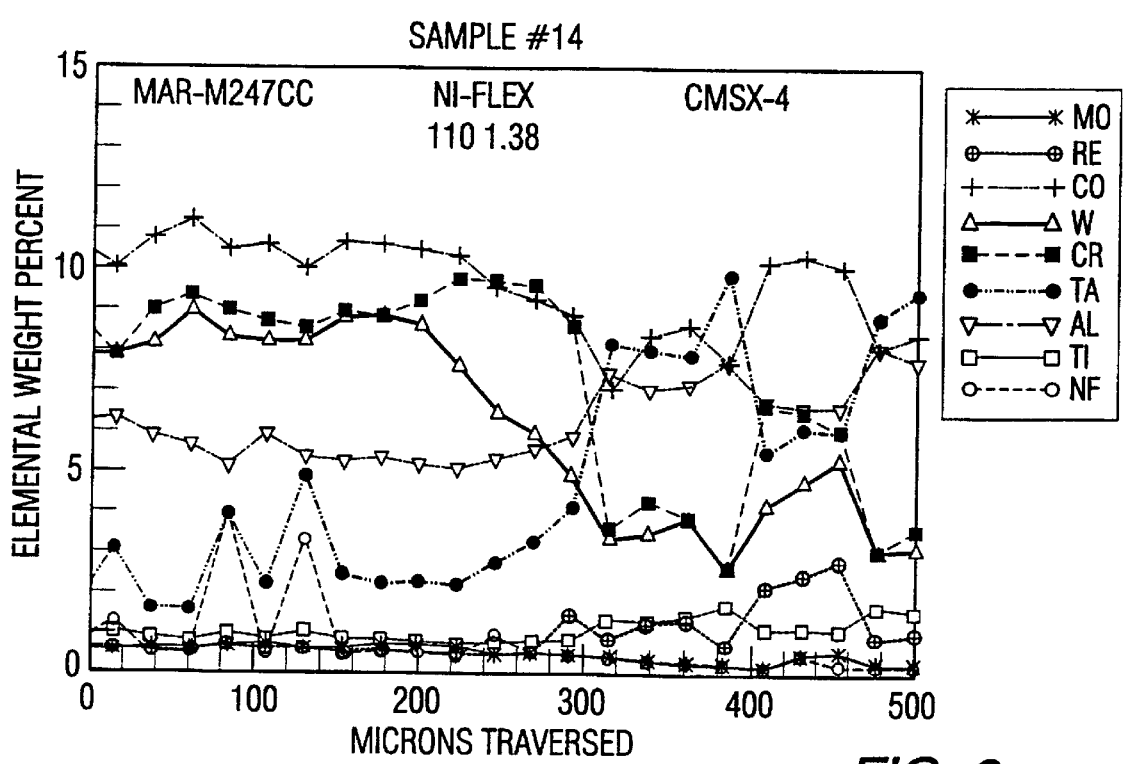
FIG. 8 is a graph showing the concentration of various elements across the bond region of a single crystal superalloy and polycrystalline superalloy joint.

FIG. 8 shows the corresponding chemistry variations for the bond between single crystal CMSX-4 and polycrystal CM247.

In order to bond blade parts as a complete process, it is preferable to integrate the heat treatment cycles for both the single crystal and polycrystalline parts of the component. In particular, it is generally not be possible for the conventionally cast polycrystalline material to withstand the high solution heat treat temperatures employed for the single crystal material. Tables 3a–c illustrate typical heat treatment cycles that may be used for the single crystal and polycrystalline alloys, CMSX-4 and CM247, and also show how the combined heat treatment cycle for bonding of a complete single crystal/polycrystalline blade is derived from the two cycles.

TABLE 3a

CMSX4 Bond and Heat Treatment

| | |
|---|---|
| Bond at 2,250° F. in as-cast condition | Liquid phase bonding and diffusion of B to elevate the local melting point from 2,250° F. to above 2,400° F. |
| Solution treat 6 hours at 2,410° F. | Homogenize bonded single structure and chemistry |
| Precipitation heat treatment 2,084° F. for 4 hours | Initiate formation of coarse γ' which will grow to 0.5 μm on subsequent aging heat treatment |
| Aging heat treatment 1,600° F. for 24 hours | Grow coarse γ' to 0.5 μm and precipitate fine, e.g., 200–500Å sized secondary spheroidal γ' |

TABLE 3b

CM247 Bond and Heat Treatment

| | |
|---|---|
| Bond at 2,150° F. for 4 hours | Liquid phase bonding and diffusion of B to elevate melting point to above 2,150° F. |
| Solution heat treatment 2,150° F. for 4 hours | Partially homogenize polycrystalline chemistry and γ phase structure |

Note: the two steps listed above can occur simultaneously

| | |
|---|---|
| Precipitation heat treat 1,950° F. for 4 hours | Initiate formation of coarse γ' which will grow on subsequent aging heat treatment |
| Aging heat treatment 1,600° F. for 24 hours | Grow coarse γ' to optimum size (~0.5 μm) and precipitate 200–500Å secondary spheroidal γ'. Also precipitate interdendritic and grain boundary carbides |

TABLE 3c

Combined CMSX-4 - CM247 Bond and Heat Treatment

| | |
|---|---|
| Bond SC segments only at 2,250° F. for 4 hours | Liquid phase bonding and diffusion of B to elevate melting point of SC portions above 2,410° F. |
| Solution heat treat bonded SC segments only at 2,410° F. for 4 hours<br>Bond CC to SC sections at 2,150° F. for 4 hours | Homogenize SC and bond region chemistry and structure<br>Liquid phase bonding and diffusion of B into bonded regions to elevate melting point of CC above 2,150° F.; partially solutionize CC; initiate coarse γ' precipitation in SC |
| Precipitation heat treat* 1,950° F. for 4 hours | Grow coarse γ' in SC portion; initiate coarse γ' precipitation in CC region |
| Age heat treatment 1,600° F. for 24 hours | Grow coarse γ' to near optimum size in SC and polycrystalline portions; precipitate fine secondary γ' spheroids in both portions; also precipitate interdendritic/intergranular carbides in CC portion |

*May be modified by an equivalent treatment practice to accommodate coating cycles.

In the combined cycle, the single crystal pieces are bonded in the as-cast condition. The bonded single crystal pieces are then solution treated at relatively high temperature. The solution treated single crystal segment and the as-cast polycrystalline segments are bonded under conditions that would be employed to bond the polycrystalline material. This step induces some growth of the primary γ' in the single crystal alloy. The bonded aggregate is then subjected to another aging step which induces growth of the primary γ' in the polycrystalline alloy and more growth of the primary γ' in the single crystal alloy. The aggregate is subjected to a final low temperature aging step which modifies the primary γ' and also grows the secondary γ' in both alloys to produce an optimized microstructure in the single crystal/polycrystalline blade. The temperature and times shown in the previous tables demonstrate how the full heat treatment cycle may be selected to optimize the overall structure and properties.

Bonding of single crystal nickel-base superalloys employs a bonding foil that is similar in composition to the base material but contains an additional melting point depressant such as from about 1 to about 3 weight percent boron to depress the melting temperature of the foil. The major element composition is close to that of the base material to provide approximately uniform chemical distribution across the bond region after solidification.

The chemistry of the bonding medium, either paste or foil, and the thermal cycle required to effect bonding can be controlled so that the resultant joints display a continuous gradation of chemistry and microstructure and the properties produced in the joint region are generally between those of the base single crystal or the polycrystalline material, or at least about 80 percent of the properties of the weaker base material component. However, in the critical portions of the turbine blade, such as regions of the airfoil, the full properties of the base material are realized.

The bonding process occurs isothermally at a temperature that is above the melting point of the foil but below the macro-melting point of the alloy, e.g., by about 100 to 150° F. The bonding thermal cycle is sufficient to cause solid state diffusion to disperse the boron away from the bonded interface, thereby raising the local melting point to make the material suitable for conventional heat treatment of the single crystal. The method may be used to bond single crystal alloys such as CMSX-4 and the like.

Parts preparation for bonding large parts such as the blades of land based gas turbines requires very good bond surface matching or fit-up, on the order of about 0.0025 cm (0.001 inch) between the two surfaces. This precision can be produced in parts after casting by low stress grinding/machining of the surfaces or by co-electrodischarge machining of the mating parts. These procedures produce surface profiles that lie within about 0.0025 cm (0.001 inch). The method also produces surfaces that are sufficiently undeformed that they are not vulnerable to recrystallization during subsequent bonding and heat treatment cycling including the high temperature solution treatment of single crystal alloys, e.g., the solution heat treatment of CMSX-4 at 2,408° F.

In accordance with an embodiment of the present invention, the ability to bond single crystal portions of gas turbine components to each other opens up the potential not only for cost effective manufacturing of defect free single crystal blades and vanes but also allows for the development of advanced components that incorporate advanced geometric features, such as precisely corrugated cooling passages, that cannot be manufactured by conventional single piece castings. The present method enables high yield production of complex defect free single crystal parts for gas turbines.

Because of the severe temperature and stress operating conditions for which single crystal gas turbine components are intended, bonded single crystals must display continuous and nearly optimum chemistry, crystallography and microstructure across the bond line. Under these conditions the bond region properties dictate the requirements of base material mechanical properties. In particular, the high temperature strength requirements dictate that the γ/γ' microstructure in the bond region should be substantially equivalent to that elsewhere in the single crystal. For second generation superalloys as exemplified by the alloy CMSX-4 this is a continuous regular arrangement of approximately 0.5 μm cuboids of γ' with finer spheroidal secondary and tertiary distributions of γ' in the γ channels between the cuboids.

Figure 9:
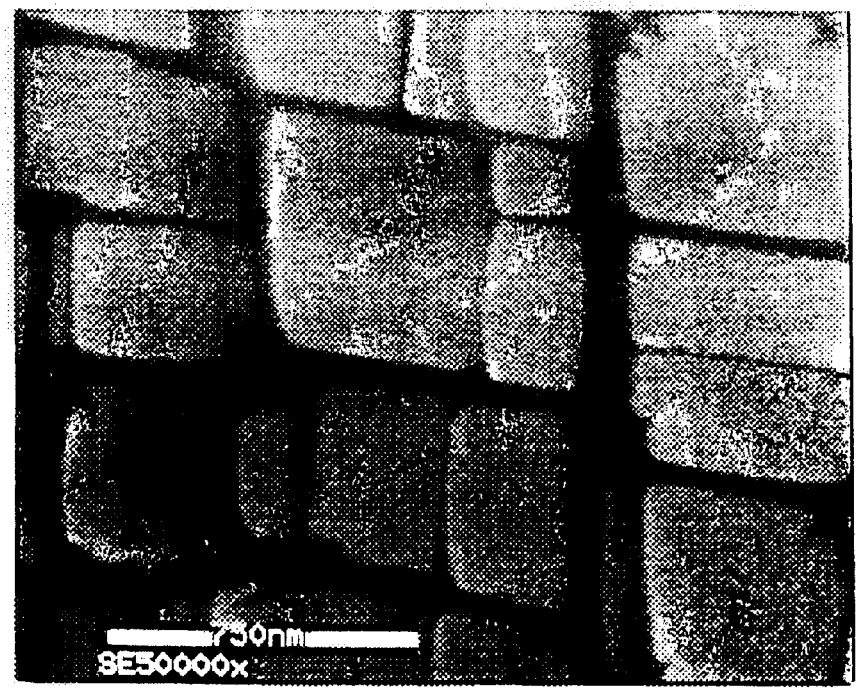
FIG. 9 is a photomicrograph showing a preferred microstructure for a single crystal nickel-based superalloy.

FIG. 9 illustrates this optimum structure for the single crystal alloy CMSX-4. This structure is optimized to give the best high temperature time dependent properties such as creep resistance.

Transient liquid phase bonding is a joining process that produces high quality joints in superalloys. In this isothermal process, a thin strip of bonding material, e.g., foil or agglomerate paste, is placed between the two portions of the material to be bonded. The bonding material is similar to the base material but it also contains an extra addition of melting point depressing element that also exhibits rapid solid state diffusion in the alloy. For nickel base alloys Si and B are preferred melting point depressants. For high temperature applications that would be experienced in bonded single crystal components B is preferred because Si can cause corrosion problems.

The present bonding process is conducted substantially isothermally at a temperature that lies above the melting point of the foil but below the bulk melting point of the base material. As the boron rich foil melts it wets the base material on either side of the bond and causes some dissolution of the base metal and a wider liquid zone. As the liquid zone widens the concentration of boron in the liquid falls until the melt pool is sufficiently diluted in B that it is at the equilibrium liquidus concentration. Simultaneously solid state diffusion causes boron to be removed from the bond pool environs. These two processes result in depletion of the melting point depressant from the bond pool and isothermal resolidification of the bond pool until the two solidification fronts meet at approximately the center line of the bond.

By carefully controlling the chemistry of the bond medium and the temperature of the bonding process, the present isothermal bonding process can be controlled to reproduce the chemistry and microstructure of the base material within the bond zone.

During the bonding process, certain parameters are preferably controlled. The amount of melting point depressant should be sufficient to provide a bonding foil that will melt significantly below the base material (i.e., a few hundred °F.). The bonding temperature should be sufficient to melt the bond foil and a similar thickness of the base material to produce a fine, well mixed bond zone. The amount of bonding foil should be sufficient to produce melting of the base material and provide a fine well controlled bond joint. The bond zone melting and resolidification should be sufficiently well controlled that deleterious chemical and phase separation does not occur within the bond zone. The major element chemistry of the bond foil (i.e., Ni, Cr, Co, Al, Ti, Ta, W, Mo, Nb etc.) should be sufficiently well matched to the material to be bonded that the chemistry and structure of the bond zone are effectively continuous with those of the base material. The bond foil composition does not have to be identical to that of the base material since some mixing will take place in the molten zone. Also, because Al and Ti will segregate to the final material to solidify, these elements may be removed from the bond foil in order to avoid the formation of deleterious γ' eutectics at the bond center line. In addition, it is preferred to control or match the crystallography across the bond, i.e., match the crystallographic orientations of the pieces to be bonded. The base material composition and its melting point, the bond foil major element composition, the amount of boron and the temperature for isothermal bonding are all interacting variables that determine the chemistry and structure of the bonds produced by the present process. The addition of B to a nickel base alloy depresses its melting point by about 100 to 150° F. per each weight percent addition. With melting points of over 2,400° F., and incipient melting points of the segregated as-cast form somewhat lower, foils comprising from about 1 to about 3 weight percent B can reduce the melting point to within the 2,000 to 2,300° F. regime that will allow for localized melting without overall melting. Although the major element composition of the bond foil is ideally very close to the base material, considerable differences can actually be tolerated. Because of the many alloying elements in a single crystal superalloy, small changes in the composition do not significantly affect the melting point. Also, dissolution of the base material into the bond zone melt pool tends to compensate for differences in bond foil and base metal composition. Furthermore, some expensive elements such as rhenium may not be desired in the foil in order to reduce costs. Finally, in order to suppress eutectic γ' formation during resolidification of the bond region, the titanium and aluminum contents of the bond foil should be reduced.

The present method may be applied to nickel base single crystal superalloy CMSX-4. The composition of the alloy is given in Table 4. Also listed in Table 4 are the compositions of several bonding foils that may be employed to fabricate transient liquid phase bonds with single crystals of CMSX-4.

foils are a series of commercial foils obtainable from Materials Development Corporation of Medford, Mass. Although the compositions of these foils appear to be significantly different from CMSX-4, excellent bonds were made with several of these foils as discussed below.

The bonding temperature is selected to lie between the melting point of the foil and the melting point of the base material. Since boron depresses the melting point of nickel alloys by about 100 to 150° F. per each weight percent addition, 1 to 3 weight percent boron will depress the melting point of the single crystal alloys from over 2,400° F. into the 2,300 to 2,000° F. range. Control of the bonding temperature with respect to the boron content determines the width of the bond zone, the elemental mixing that occurs on dissolution, and the segregation that occurs on resolidification. Higher temperature bonding allows for rapid wetting of the bond surfaces by the melted foil, good bond pool mixing, and accelerated solid state diffusion of the boron to increase the rate of resolidification process. Higher temperature bonding also allows the use of reduced B containing foils, thereby avoiding the need for extensive solid state diffusion and the potential formation of boride particles during the solidification process.

After initial trials, a bonding cycle of 2,250° F. for 4 hours was selected for the bonding foils since this temperature produced controlled bond regions and did not appear to produce any deleterious γ' growth. Because of the large alloying content of the base alloy and the foil, the metallic element composition of the foils does not have a significant effect on the melting point depression of the base alloy. It does, however, have a significant effect on the chemical composition of the resolidified bond zone and the microstructure that is generated within the bond zone upon heat treatment.

The chemical segregation of the elements within the bond zone after solidification is controlled by the bond zone size and the degree of dissolution of the base metal during the first stages of the bonding process. It is also affected by the state of the base material, i.e., segregated or homogenized. This issue is manifested in bonding of the as-cast CMSX-4 with high boron containing foils in which γ' eutectics are formed at the bond line due to preferential dissolution of the γ' enriched interdendritic regions of the segregated casting.

TABLE 4

Base Alloy and Bonding Foil Compositions (Weight Percent)

| Alloy | Ni | Cr | Co | Al | Ti | Nb | Mo | Ta | W | Re | Hf | Zr | B |
|---|---|---|---|---|---|---|---|---|---|---|---|---|---|
| CMSX-4 | bal | 6.6 | 9.6 | 5.5 | 1.0 | — | 0.6 | 6.5 | 6.4 | 3 | 0.9 | — | — |
| W-foil 1 | bal | 6.5 | 9.6 | 5.5 | 1.0 | — | 0.6 | 6.5 | 6.4 | 3 | 0.9 | — | 1.5 |
| W-foil 2 | bal | 6.5 | 9.6 | 2.9 | 0.5 | — | 0.6 | 6.5 | 6.4 | 3 | 0.9 | — | 1.5 |
| W-foil 3 | bal | 6.5 | 9.6 | 5.5 | — | — | 0.6 | 6.5 | 6.4 | 3 | 0.9 | — | 1.5 |
| W-foil 4 | bal | 6.5 | 10 | 2.9 | — | — | 0.6 | 6.5 | 6.4 | 3 | 0.9 | — | 1.5 |
| Ni-Flex 110 1.3B | bal | 10 | 5.0 | 2.0 | — | — | — | 4.0 | 4.0 | — | — | — | 1.3 |
| Ni-Flex 110 1.7B | bal | 10 | 5.0 | 2.0 | — | — | — | 4.0 | 4.0 | — | — | — | 1.7 |
| Ni-Flex 110 2.5B | bal | 10 | 5.0 | 2.0 | — | — | — | 4.0 | 4.0 | — | — | — | 2.5 |
| Ni-Flex 115 3.0B | bal | 9.0 | 8.0 | 2.0 | — | — | — | 4.0 | 4.0 | — | 1.0 | — | 3.0 |
| Ni-Flex 120 1.7B | bal | 10.0 | 5.0 | 1.3 | 1.0 | — | — | 5.0 | 3.0 | — | — | — | 1.5 |
| Ni-Flex 120 1.9B | bal | 10.0 | 5.0 | 1.3 | 1.0 | — | — | 5.0 | 3.0 | — | — | — | 1.7 |
| Ni-Flex 121 2.4B | bal | 10.0 | 10.0 | — | — | — | — | 5.0 | — | — | — | — | 2.4 |
| Ni-Flex 121 3.0B | bal | 10.0 | 10.0 | — | — | — | — | 5.0 | — | — | — | — | 3.0 |

The W-foils 1 to 4 are derivatives of the CMSX-4 alloy composition with 1.5 weight percent B added for melting point depressions. The amounts of Al and Ti are adjusted to study the effect of eutectic γ' forming additions on the chemistry and structure of CMSX-4 bonds. The Ni-Flex The eutectic material is then redeposited at the bond line. This problem can be alleviated or avoided by using homogenized, solution treated CMSX-4 if high boron foils are used. In this case, the homogenized structure melts uniformly to produce a melt pool that is less enriched in the γ' eutectic forming elements. Consequently the resolidified bond zone does not display the deleterious γ' eutectics.

TABLE 5

Ramped Solution Heat Treatment Cycle for CMSX-4

| Time (minutes) | Temp (° C.) | Temp (° F.) |
|---|---|---|
| 0 | 23 | 73 |
| 60 | 1027 | 1880 |
| 80 | 1027 | 1880 |
| 110 | 1235 | 2255 |
| 140 | 1235 | 2255 |
| 170 | 1260 | 2300 |
| 185 | 1260 | 2300 |
| 215 | 1277 | 2330 |
| 335 | 1277 | 2330 |
| 365 | 1288 | 2350 |
| 485 | 1288 | 2350 |
| 500 | 1296 | 2365 |
| 680 | 1296 | 2365 |
| 695 | 1304 | 2380 |
| 875 | 1304 | 2380 |
| 890 | 1313 | 2395 |
| 1130 | 1313 | 2395 |
| 18 hours 50 minutes | | total cycle time |

Post bond heat treatment should generate the optimum chemistry and structure, not only on the bond region but also in the remaining portions of the base metal. This heat treatment cycle should homogenize the segregated structures obtained after casting and resolidification, and also cause the precipitation and growth of the optimum form of the strengthening γ' precipitates. Conventional solutioning and heat treatment cycles recommended for CMSX-4 may be adequate to achieve this. The solution treatment is a ramped heat treatment of the type identified in Table 5. By slowly increasing the temperature during this cycle, incipient melting is substantially avoided by allowing solid state interdiffusion that raises the local melting temperature. This process is effective in homogenizing as-cast single crystals, and it is also effective in homogenizing the resolidified bond zone. Furthermore, it is effective in increasing dispersion of the boron through the single crystal to prevent melting of the boron enriched bond line. For example, it helps avoid the potential problem that the bond zone developed after 4 hours at 2,250° F. may have a melting point below the peak solution treating temperature of 2,408° F. The potential exists for shortening this cycle since the 4 hours at 2,250° F. will have assisted in homogenizing the segregated single crystal, and diffusion of boron is more rapid than diffusion of the metallic alloying elements.

After solution heat treatment, a precipitation heat treatment sequence is preferably applied to generate the optimum form of the strengthening γ' precipitates. A treatment of 2,084° F. for 4 hours and 1,650° F. for 24 hours is applied to generate approximately 0.5 μm cuboidal primary γ' precipitates and a dispersion of spheroidal secondary and tertiary γ' precipitates in the matrix channels between the cuboids. By applying these heat treatments which have been developed for processing the base single crystal alloy, the microstructure in the unbonded portions of the bonded part are optimally heat treated in a addition to the bonded region.

Figure 10:
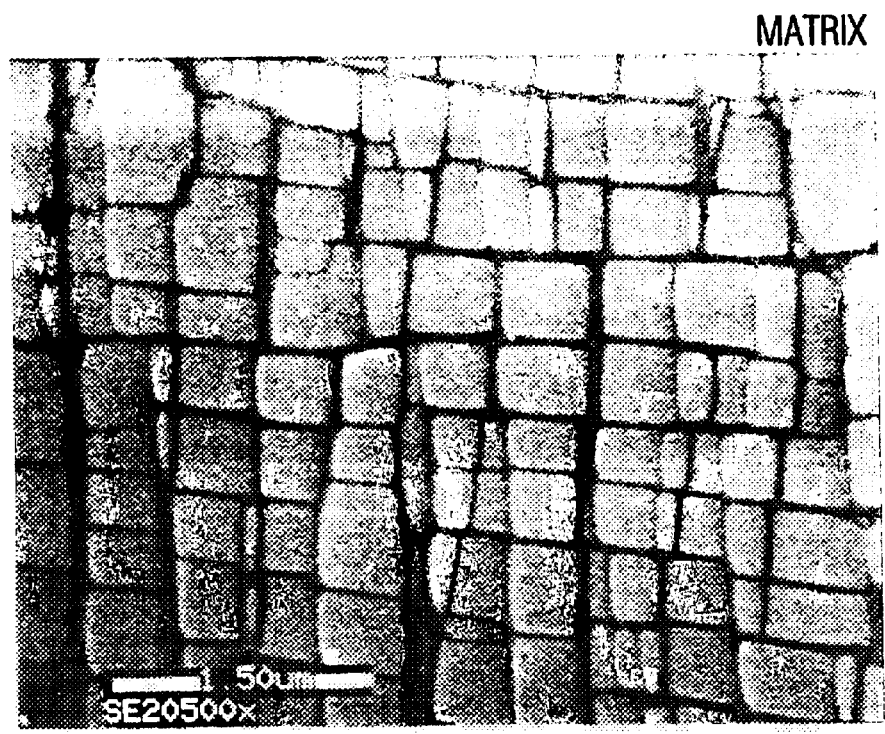
FIG. 10 is a photomicrograph showing the microstructure of a single crystal nickel-based superalloy that may be bonded in accordance with an embodiment of the present invention.
Figure 11:
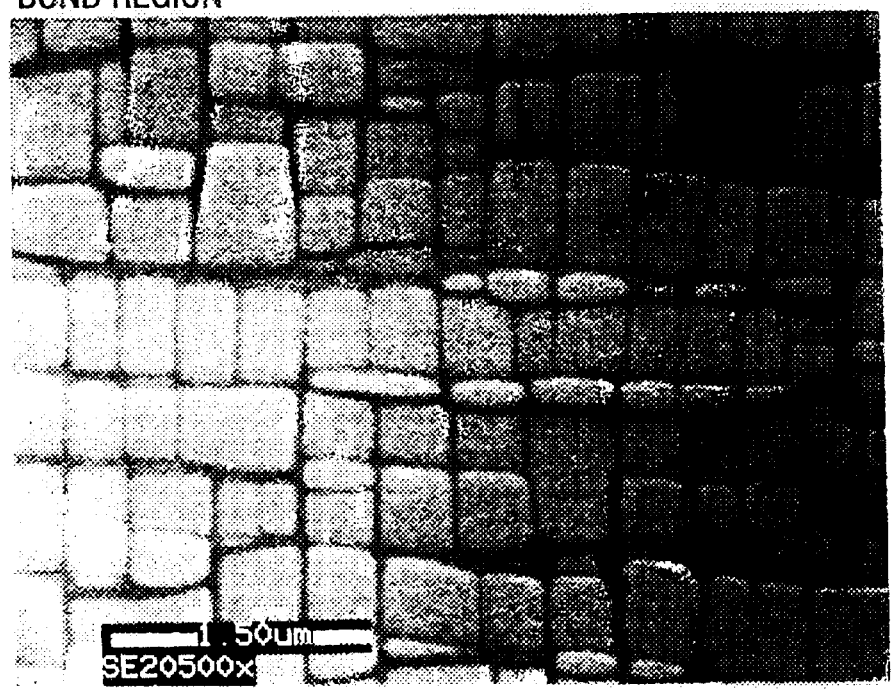
FIG. 11 is a photomicrograph showing the microstructure of a transient liquid phase bond region of the superalloy of FIG. 10.

FIGS. 10 and 11 are photomicrographs of the matrix region and bond region, respectively, of a single crystal nickel superalloy, illustrating how similar structures are developed in the bond region and away from the bond region in a sample that has been bonded under the preferred conditions. The preferred conditions for bonding CMSX-4 single crystals is to use a 1.3 weight percent B foil, bonding at 2,250° F. for 4 hours followed by solution heat treatment using a ramped heat treatment up to 2,408° F., holding for 4 to 6 hours, cooling to room temperature, and subsequently precipitation heat treating at 2,084° F. for 4 hours and 1,650° F. for 24 hours. This process generates the preferred structure. Other variations of this process can be employed to generate acceptable microstructures.

Table 6 shows how foils identified in Table 4 can be processed to deliver uniform bond structures. This table also identifies some of the key microstructural features that are developed during processing.

Figure 12:
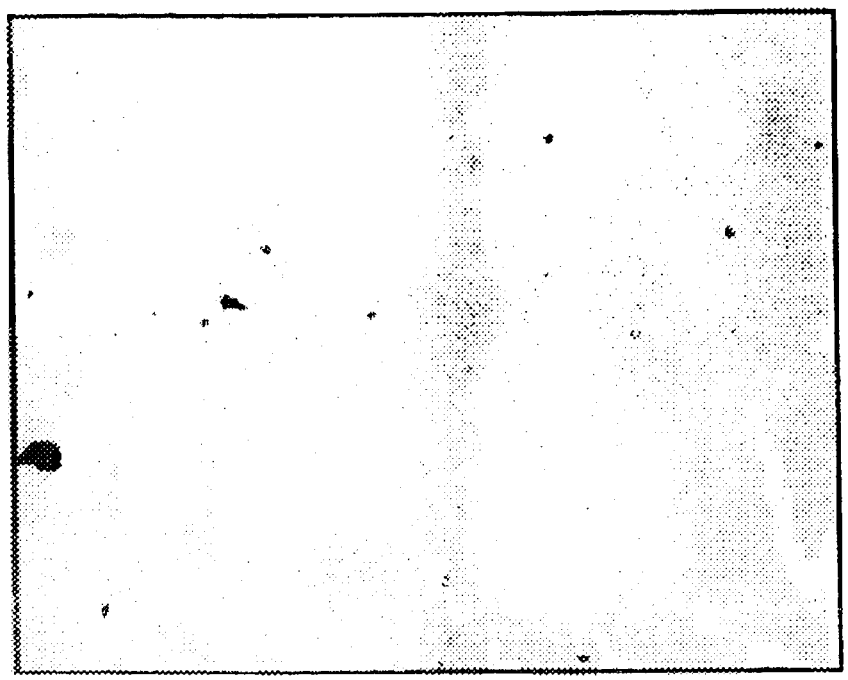
FIG. 12 is a photomicrograph showing the as-cast structure of a single crystal nickel-based superalloy bonded with a boron-containing foil.

FIG. 12 illustrates the clean bond region that is produced by bonding CMSX-4 with one of the low B bonding foils.

Figure 13:
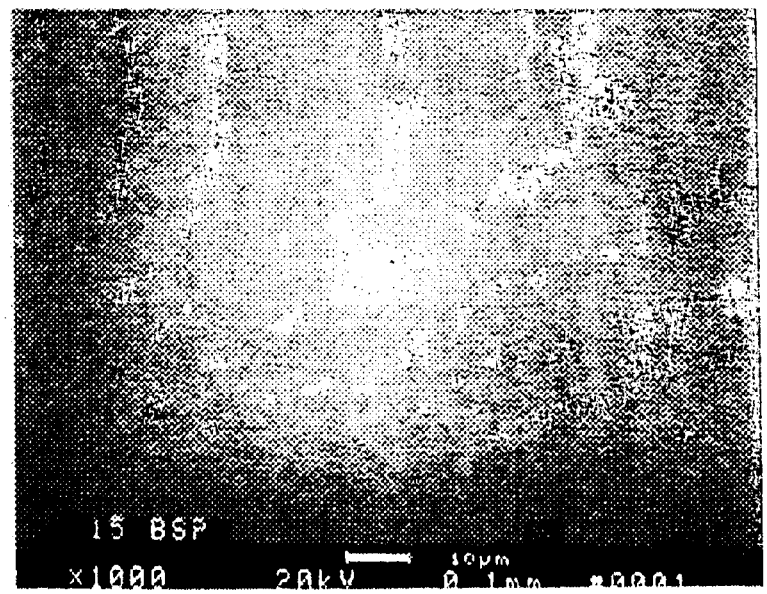
FIG. 13 is a photomicrograph showing the microstructure of the superalloy of FIG. 12 after heat treatment.

FIG. 13 shows a corresponding micrograph after solution heat treatment.

Figure 14:
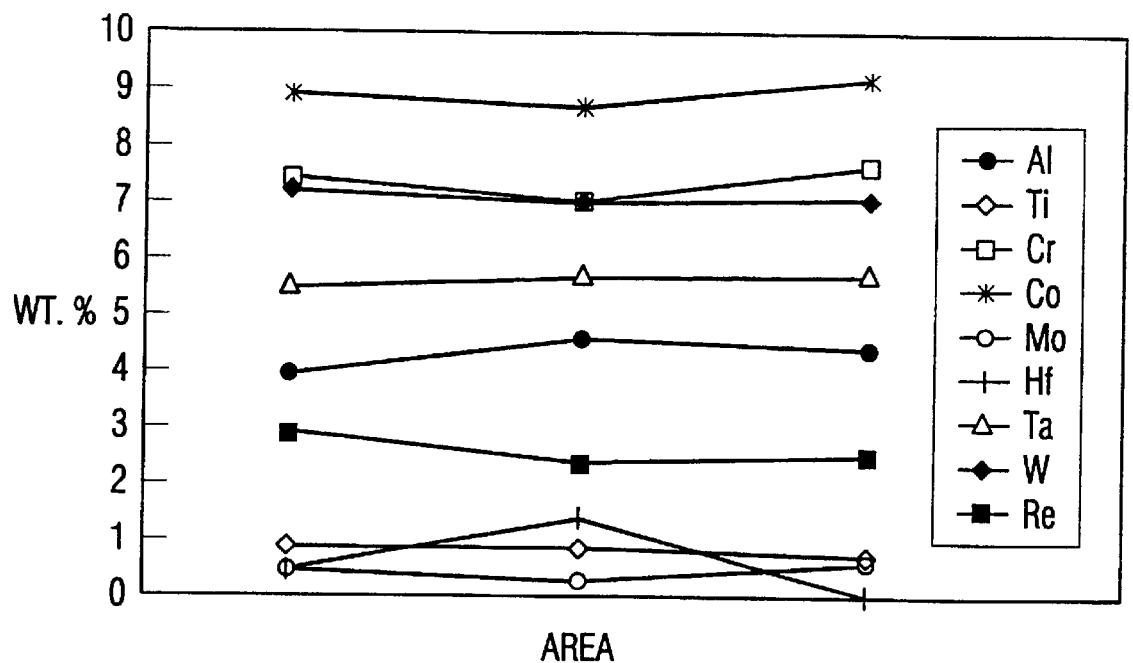
FIG. 14 is a graph showing the concentration of several elements across a transient liquid phase bond zone of a single crystal nickel-based superalloy bonded with a boron-containing foil.

FIG. 14 presents some chemical analysis traces across the solution treated region.

Figure 15:
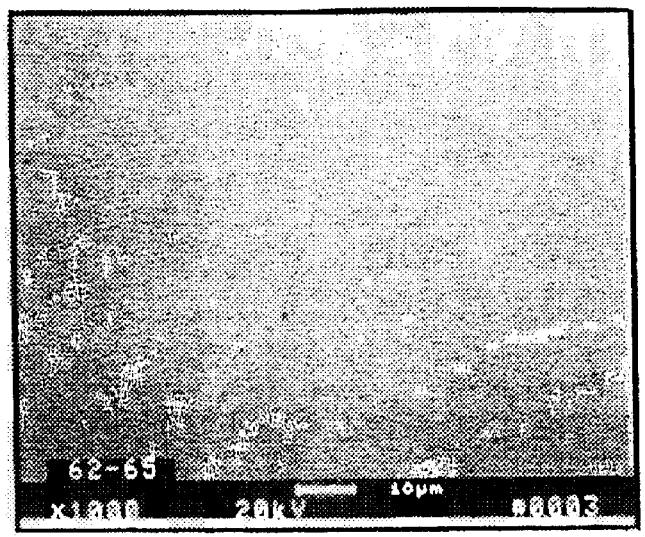
FIG. 15 is a photomicrograph showing the microstructure of a single crystal nickel-based superalloy that has undergone transient liquid phase bonding, and thermal processing in accordance with an embodiment of the present invention.
Figure 16:
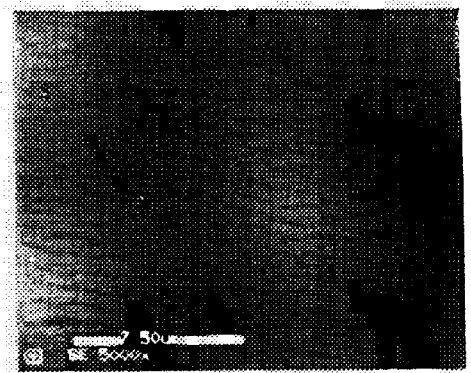
FIG. 16 is a photomicrograph showing a preferred microstructure of a single crystal nickel-based superalloy that has undergone bonding and thermal processing in accordance with an embodiment of the present invention.
Figure 17:
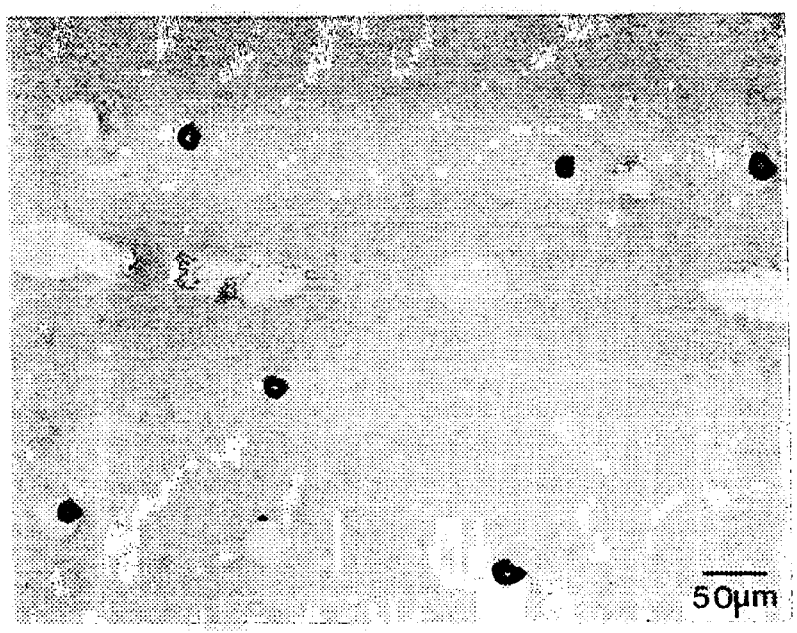
FIG. 17 is a photomicrograph showing deleterious boride particles formed at a bond line of a single crystal nickel-based superalloy bonded with a high boron-containing foil.
Figure 18:
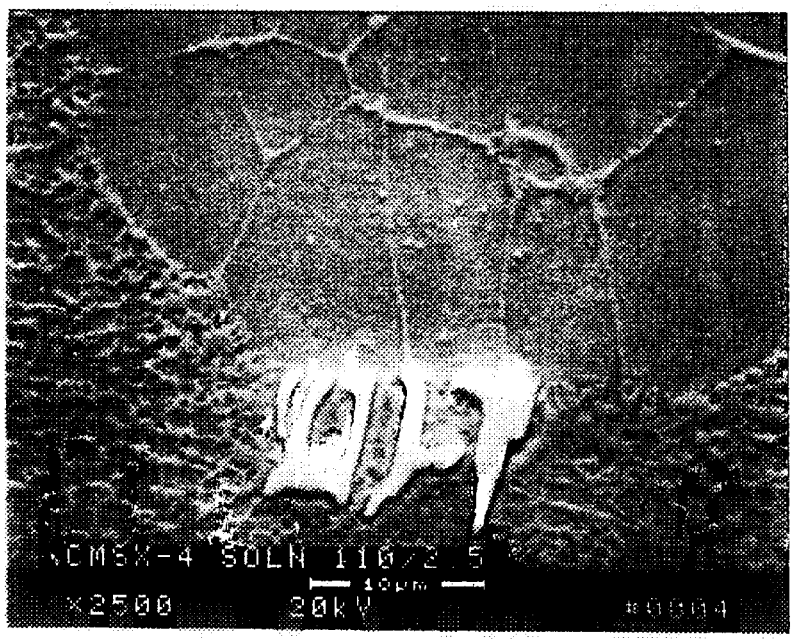
FIG. 18 is a photomicrograph showing the bond line of FIG. 17 at higher magnification.
Figure 19:
FIG. 19 is a photomicrograph showing a solutionized bond zone in a single crystal nickel-based superalloy bonded with a high boron-containing foil.

FIGS. 15 and 16 demonstrate the optimum γ' structure produced by this treatment.

Figure 20:
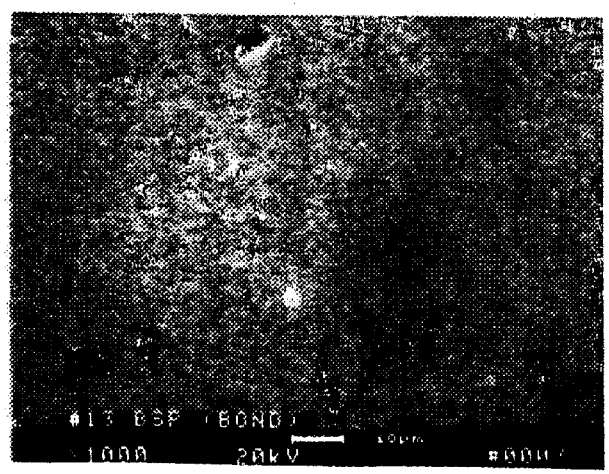
FIG. 20 is a photomicrograph showing an improved microstructure in the bond zone of a single crystal nickel-based superalloy that has undergone solution and precipitation treatment in accordance with an embodiment of the present invention.

For comparison, FIGS. 17, 18, 19 and 20 illustrate the structures produced during bonding with a high B foil. Note that the eutectic particles exhibited after bonding (FIGS. 17 and 18) are removed by the subsequent solution treatment (FIG. 19) and a structure approaching the optimum structure can be generated by precipitation heat treatment (FIG. 20).

TABLE 6

Structure of Transient Liquid Phase Bonds of CMSX-4 During Bond Processing and Heat Treatment Sequence

| Foil | Structure After Bonding | Structure After Solution Treatment | Structure After Precipitation Treatment | Preferred Process Cycle |
|---|---|---|---|---|
| W-foil 1 (1.5% B) | Clean bond region, i.e. no particles | No large particles uniform preliminary γ' particles | Uniform γ" cuboidal well formed | Bond in as-cast condition |
| W-foil 2 (1.5% B) | Clean bond region, i.e. no particles | No large particles uniform preliminary γ' particles | Uniform γ" cuboidal well formed | Bond in as-cast condition |
| W-foil 3 (1.5% B) | Clean bond region, i.e. no particles | No large particles uniform preliminary γ' particles | Uniform γ" cuboidal well formed | Bond in as-cast condition |
| W-foil 4 (1.5% B) | Clean bond region, i.e. no particles | No large particles uniform preliminary γ' particles | Uniform γ" cuboidal well formed | Bond in as-cast condition |

TABLE 6-continued

Structure of Transient Liquid Phase Bonds of CMSX-4
During Bond Processing and Heat Treatment Sequence

| Foil | Structure After Bonding | Structure After Solution Treatment | Structure After Precipitation Treatment | Preferred Process Cycle |
|---|---|---|---|---|
| Ni-Flex 110 (1.3% B) | always clean bond region | No large particles uniform precuboidal γ' particles | Extremely sharp γ' particles cuboidal identical to base | Bond in as-cast condition |
| Ni-Flex 110 (1.7% B) | always clean bond region | No large particles uniform precuboidal γ' particles | Very sharp γ' particles cuboidal very similar to base | Bond in as-cast condition |
| Ni-Flex 110 (2.5% B) | particles when bonded in solution treated condition | particles dissolve on solution treatment | Sharper γ' cuboids when sol treated material is bonded | Bond in solution treated condition |
| Ni-Flex 115 (3.0% B) | particles when bonded in solution treated condition | particles dissolve on solution treatment | Cuboidal γ' rounded corners, larger than base material's | Bond in solution treated condition |
| Ni-Flex 115 (2.5% B) | particles when bonded in solution treated condition | particles dissolve on solution treatment | Cuboidal γ' rounded corners, larger than base material's | Bond in solution treated condition |
| Ni-Flex 115 (1.7% B) | always clean bond region | No large particles uniform precuboidal γ' particles | Cuboidal γ' rounded corners, larger than base material's | Bond in as-cast condition |
| Ni-Flex 120 (1.7% B) | always clean bond region | No large particles uniform precuboidal γ' particles | Very sharp γ' very similar to base material | Bond in as-cast condition |
| Ni-Flex 120 (2.5% B) | particles when bonded in solution treated condition | particles dissolve on solution treatment | Very sharp γ' very similar to base material; sharper in presolutionized material | Bond in solution treated condition |

In accordance with an embodiment of the present invention, transient liquid phase bonding of fabricated single crystal turbine parts produces high quality bonds when a very small, well controlled gap is induced between the mating surfaces. These tight tolerance surface requirements can be met reproducibly by surface profiling techniques. Furthermore, the stresses created by these profiling techniques must be sufficiently low such that they do not induce recrystallization from the deformed layer of cold work during subsequent thermal cycles, including bonding and heat treatment.

Surfaces for transient liquid phase bonding may be prepared by low stress grinding if the surface is sufficiently planar, or by electrodischarge machining (EDM) where the electrical conditions are sufficient to maintain a spark gap of about 0.0025 cm (0.001 inch) between the work piece and the work tool. For parts of complex profile that must fit together, such a surface profile can be produced by a co-EDM process which employs one of the mating pieces as the process anode and the other as the cathode. Subsequently, bonding using, for example, 0.0025 cm (0.001 inch) thick foil material or its equivalent in paste provides for sufficient melting and resolidification during bonding. The bond region material and material adjacent to the bond material do not recrystallize during the bond cycle or subsequently during higher temperature solution treating of the single crystal material.

Recrystallization is preferably avoided by maintaining a sufficiently small zone of deformation during shaping. In the absence of the transient liquid phase bonding process, the material is so minimally deformed that it will not recrystallize or will only recrystallize to a depth on the order of the thickness of a bonding foil, e.g., about 0.0025 cm (0.001 inch). In the presence of the bonding foil, the cold worked layer is rapidly consumed by the transient melting process and the resolidification process occurs as single crystal growth from the base material. Under these sets of conditions, recrystallization will not occur prior to transient melting at the bond regions. Subsequent melting and solidification reproduces defect free single crystals. If the single crystals are machined and bonded in the as-cast condition, subsequent solution heat treatment can be performed at temperatures as high as about 2,410° F. without causing recrystallization in the bond region.

The single crystal alloy CMSX-4 may be bonded in the as-cast condition and subsequently heat treated if the surfaces are low stress ground according to the following process: cast single crystal parts; clean off mold with light sand blast of less than 100 psi air with 90 grit particles; low stress grind bonding surfaces flat and parallel to within 0.0025 cm (0.001 inch); bond at about 2,250° F. using foil Ni-Flex 110 comprising 1.3 weight percent B by ramp heating to 2,250 F. from 1,600° F. within 60 minutes in vacuum; solution treat bonded entity in vacuum using cycle shown in Table 5 (maximum temperature of 2,408° F. for 4 hours, cycle time about 16 to 24 hours); and precipitation treat (e.g, two step precipitation treat at 2,084° F. for 4 hours and 1,652° F. for 24 hours).

Low stress grinding not only produces flat and parallel surfaces that can be finished to a very high tolerance, on the order of fractions of a thousandth of an inch, but it also produces a relatively deformation free surface region in nickel base superalloys. Such ground surfaces do not contain sufficient stored plastic work to cause recrystallization in the near surface region. When these surfaces are heat treated, the surfaces do not recrystallize. Particularly, when the bonding material is melted over the worked surface, recrystallization is inhibited. For the competing processes of solid state γ' dissolution, local surface melting and recrystallization, it appears that local surface melting is the process with the most rapid kinetics.

Figure 21:
FIG. 21 is a photomicrograph showing a bond line between opposing surfaces of a single crystal nickel-based superalloy.

FIG. 21 is a micrograph of the cross-section of the bonded joint of two CMSX-4 single crystals prepared by low stress grinding prior to bonding and heat treatment. On another non-bonded surface of the sample that had been surface ground, recrystallization was also suppressed.

Alternatively, the single crystal alloy CMSX-4 may be bonded in the as-cast condition and subsequently heat treated if the bonding surfaces are prepared by co-electrodischarge machining using electrical conditions that produce a part gap of about 0.0025 cm (0.001 inch). The following process may be employed: cast single crystal parts; clean off mold with light sand blast of less than 100 psi air with 90 grit particles; co-EDM mating surfaces using sufficient voltage and current to produce 0.001 spark gap; bond at 2,250° F. using foil Ni-Flex 110 comprising 1.3 weight percent B which is heated to 2,250° F. from 1,600° F. within 60 minutes in vacuum; solution treat bonded article in vacuum using cycle shown in Table 9 (maximum temperature of 2,408° F. for 4 hours, cycle time of about 16 to 24 hours); and precipitation treat (e.g., two step precipitation treat at 2,084° F. for 4 hours and 1,652° F. for 24 hours).

Figure 22:
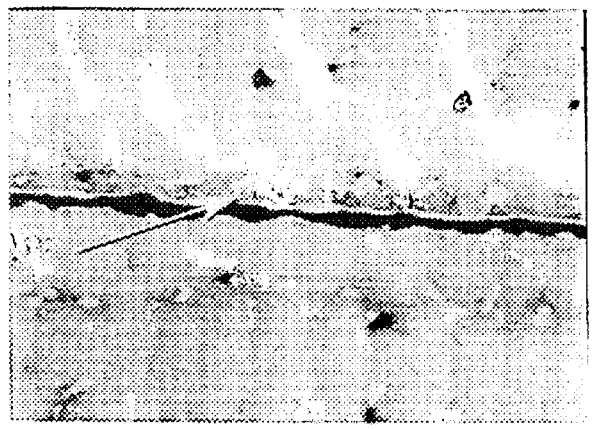
FIG. 22 is a photomicrograph showing the tight clearance between two opposing surfaces of single crystal nickel-based superalloy segments prior to transient liquid phase bonding thereof in accordance with an embodiment of the present invention.

FIG. 22 shows a cross-section containing the surface of the sample after co-EDMing. In this figure, the thin recast layer formed by EDM appears as the very light film at the surface of the sample.

Figure 23:
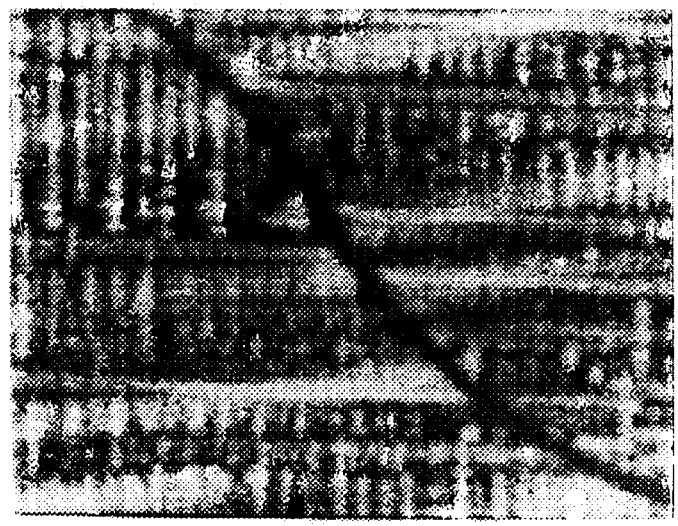
FIG. 23 is a photomicrograph showing a bond line between single crystal nickel-based superalloy segments.

FIG. 23 shows a cross-section of a CMSX-4 joint after bonding and heat treatment, demonstrating that the process produces single crystal resolidification and that the chemistry of the bond region has retained the as resolidified structure.

The present processes are sufficiently non deforming to inhibit recrystallization of the material near the bond surface. This property is required for the production of acceptable transient liquid phase bonds in single crystal materials such as CMSX-4. In addition to these machining processes, lower stress processes such as mechanical grinding to 600 grit finish and polishing, e.g., to 0.25 $\mu$m with diamond abrasive may be employed to produce surfaces of suitably low deformation that are suitable for bonding.

Because of the large size of land-based turbine components, very small distortions from design specifications can produce large absolute deviations from the desired parts profiles. While these offsets are significant in single piece castings, in the production bonded parts they become critical because of their influence on the relative fit-up between parts. Effectively, very small relative distortions between two parts can produce very large gaps that may be inadequately or incompletely filled by the bonding process. To produce bonded parts with acceptable quality it is desirable to control the casting process to restrict such gaps, or to modify the post cast processing to adjust the gaps between the parts. The proposed sequence of processes provides a simple series of processes that provide for the control of such gaps and effective bonding procedures.

The sequence of processes avoids deleterious recrystallization. Recrystallization can occur when metal working processes and subsequent heat treatment cycles combine to provide sufficient stored cold work and sufficient thermal energy to locally form new grains. For nickel base single crystals used in turbine components, such working can include bending, indenting, chipping by metal working tools and even excessively severe cleaning by grit or shot blasting. The damage induced by these processes can cause recrystallization when they precede the solution treatment at about 2,400° F. that is required for such single crystals. In accordance with a preferred embodiment of the present invention, processes to manufacture fabricated parts from initial castings require careful sequencing of the cleaning, bonding and heat treatment cycles. For bonded parts it is desirable to remove substantially all of the remnants of the casting shell from the part before bonding. Additionally, bonding is preferably performed before solution treating. It is therefore critical to control and sequence the parts processing steps to avoid the potential of recrystallization. The present processing route limits the amount of deformation that is induced into parts by processing, and allows for a heat treatment cycle that provides optimized properties in the bond region as well as in the single crystal away from the bond.

Utilizing careful, low pressure cleaning, controlled high temperature shaping, and co-EDMing of fitting parts, the process provides a simple cost effective route to manufacture single crystal turbine blades from multiple cast parts.

A single crystal gas turbine blade may be fabricated from separately cast parts by the following sequence: mechanically cleaning the parts prior to bonding; bonding the parts prior to applying a high temperature solution heat treatment; avoiding recrystallization during heat treatment that may arise from local deformation of the surface during cleaning; providing good fit up of the parts to be joined (e.g., to within 0.0025 cm (0.001 inch) across the bonded surface); and providing good parts profiles throughout the length of the blade. An integrated sequence involving transient liquid phase bonding of processed parts accomplished these objectives.

It is preferred to clean the cast parts and to make them conform precisely to the desired shape without inducing deformation that will impart recrystallization during subsequent heat treatment. Although cleaning of the mold from single crystal cast parts is conventionally performed after solution heat treatment to avoid recrystallization, the present components are fully cleaned prior to bonding. Because the best properties are produced when the bonding is performed prior to solution heat treatment, this cleaning should precede solution heat treatment. Because of the danger of inducing recrystallization, the deformation induced during cleaning by mechanical abrasion should be minimized. This requirement mandates low stress cleaning.

For CMSX-4 abrasive cleaning in which the abrasive particles are limited to better than 60 grit and the (driving) gas pressure is limited to 90 psi has been show to avoid recrystallization when the single crystals are subsequently solution heat treated using the cycle of Table 5.

Cleaning of the future internal surfaces of the part is required, and cleaning of the external surfaces is required in all regions that will be in contact with the mechanical fixturing that is intended to maintain a tightly closed gap across the bonding surfaces.

The problem of maintaining good parts profile in long castings can be solved by either improving casting precision or by invoking mechanical processing of the cast parts. Continuously adapting the parts mold to account for casting and thermal distortion will provide a means to produce in-tolerance profile parts that are susceptible to systematic and macroscopic distortions of the part and the mold. However, changing the part and the mold will not account for run-to-run variations and non-systematic deviations from the desired profile. Since small fractional deviations can induce considerable absolute offset from the required profile over the length of large land-based turbine components, these non-systematic or run-to-run) deviations should be accommodated by other means. While polycrystalline alloys can be mechanically straightened at room temperature, conventional processing of single crystals avoids such mechanical deformation because of the danger of recrystallization.

However, it may be possible to bend single crystals of nickel base superalloys to about 40 percent strain without causing recrystallization if the temperature and strain rate are effectively controlled. This process may be applied to parts straightening, e.g., adequate shape changes of about 2 to 3 percent, while inhibiting deleterious recrystallization upon subsequent solution heat treatment.

The issue of producing minimal and consistent gaps between parts to be bonded can be solved in accordance with the present invention by casting the parts over size, and machining the excess stock from the mating surfaces in a coordinated manner. The mating surfaces should then be aligned to within about 0.0025 cm (0.001 inch) to ensure a good transient liquid phase bond. Co-electrodischarge machining not only has the capability to finish the surfaces of matching components, but also provides a sufficiently smooth finish. Moreover, if the recast layer is controlled, post bonding recrystallization of the single crystal can be avoided. In co-EDM machining, material is removed from both of the work pieces since each piece is alternately employed as the cathode and the anode. The parts can be cast over size to provide more tolerance for the removal of material. Controlling the current during removal of material not only controls the gap between the parts (and the precision of this gap) but also controls the depth of the recast layer. The depth of the recast layer should be minimized to avoid the presence of surface and subsurface cracking and recrystallization on subsequent heat treatment. Maintaining the EDM current at a level that provides about a 0.001 inch gap between the work pieces also constrains the recast layer to be sufficiently small such that it is consumed during the subsequent transient liquid phase bonding.

Figure 24:
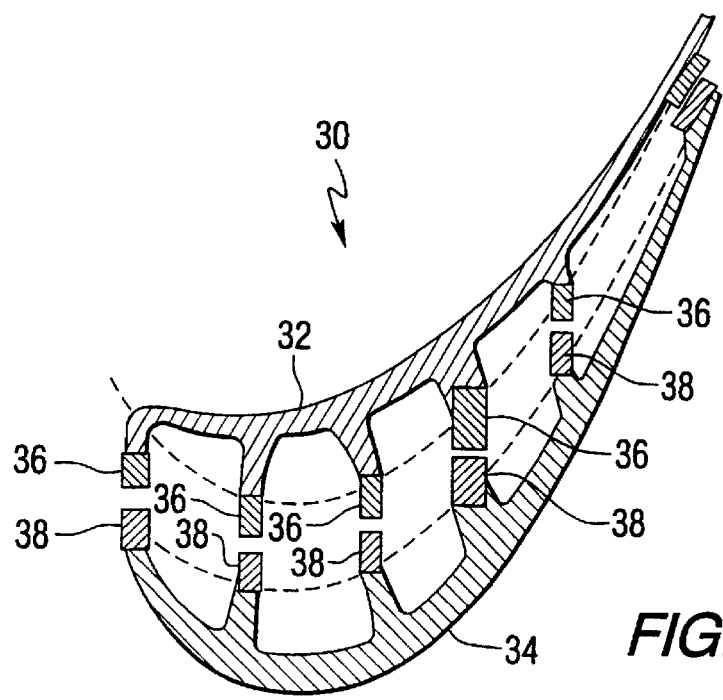
FIG. 24 is a cross-sectional view of turbine blade airfoil segments that may be machined in accordance with an embodiment of the present invention.

FIG. 24 is a cross-sectional view of a turbine blade airfoil 30 comprising two segments 32 and 34 which are separated along the camber-line of the airfoil 30. Excess material 36 and 38 is provided at the interfacing surfaces of the segments 32 and 34. FIG. 24 illustrates the appropriate geometry of the excess stock and how this is related to the motion of the electrodes during EDM machining. The excess material 36 and 38 should preferably be provided across the bond surface in the reverse direction to which it will be removed by the motion of the electrodes in the co-EDM process, as shown in FIG. 24. This motion is normal to the overall plane of the bond and not normal to the local plane of the bond. This is particularly important for ribbed parts such as internally cooled gas turbine blades.

The application of approximately 0.030 inch excess stock to the casting across the mating surface and co-Edm machining to a 0.001 inch gap provides the excellent part fit up needed for transient liquid phase bonding.

In order to maintain the parts fit up during bonding, fixturing may be needed which will maintain stress across the bond surface as the parts heat up in the furnace. The fixture must withstand the high temperatures during bonding. Molybdenum fixtures that induce compressive gap closing stresses on the parts by virtue of differential thermal expansion may be used.

Prior to assembling the parts in the fixture, a bonding medium of either foil or paste can be applied to the bond surface. The fixture not only ensures gap closure before the part is inserted into the furnace, but also maintains gap closure as the parts are heated. The bonding thermal and pressure cycle can be controlled to allow for outgassing of, e.g., binder species in the bonding paste if desired. Subsequently, the parts can be bonded using the cycle identified for the single crystal material.

A preferred process/sequence to develop the optimum overall properties in the part is: cast (grow) the single crystal parts of the blade to over size with about 0.030 inch excess stock normal to the bonding plane in order to provide sufficient stock for removal during fit-up processing; clean off the ceramic mold using transmitted vibration (e.g., hitting a disposable part of the casting such as the seed, ramp or the risers with a hand held hammer) and cleaning off any more adhesive ceramics using low pressure sand blasting (e.g., air pressure below 90 psi, sand particles below 120 grit); co-electrodischarge machine the parts to provide good fit up across the bonding surfaces; clean bonding surfaces using an alcohol (methyl or ethyl), acetone or a water soap based wash to remove carbonaceous residue from the EDM surfaces (i.e., the carbon film that can form during EDM machining of the single crystal surface); the surface may be lightly bushed during cleaning using a bristle brush to break up the surface carbon layer and to encourage flotation of the debris off into the cleaning fluid; apply a bonding medium into the gap between parts—either cut to shape foil or deposited paste to provide a bond fill of about 0.001 inch of the transient liquid phase bonding medium; fixture the parts in a bonding fixture that provides controlled loads across the bonding surface to apply normal loads to portions of the external surface of the part using pins that are aligned to be normal to the bonding plane and are located to produce the maximum closure of the gap over all of the part; bonding under high vacuum (greater than $10^{-5}\tau$) under the temperature cycle identified for the single crystal alloy (for CMSX-4 this is 2,250° F. for 4 hours); removing the fixture after cooling to room temperature; solution heat treating using the treatment that is conventionally employed for the alloy; external cleaning may optionally be employed (although this can be performed after precipitation heat treatment); precipitation heat treatment to optimize properties (in the case of CMSX-4 a two step precipitation treatment process at 2,084° F. for 4 hours and 1,652° F. for 24 hours); and mechanically dressing the turbine blade to shape and polishing.

As an additional step, the parts for bonding can optionally be straightened by bending using a process that will not induce recrystallization. This process involves high temperature low strain rate deformation (similar to superplastic deformation) that causes distortion of the part without incurring sufficient deformation damage to impart recrystallization.

An integrated processing path for bonding of single crystal parts to make complete turbine blades is thus provided. The sequenced processing steps provide the material quality and heat treatment steps needed to produce high quality single crystal components that will function at the extreme temperatures desired of gas turbine engine components. It provides all of the parts processing to generate optimum bond gap fit up and processing as well as optimum parts profile.

In summary, the process employs: as-cast components that are removed from their ceramic molds by light blasting, co-electrodischarge machining of mating parts to ensure fit up, bonding of the parts effectively in the as-cast condition, and subsequent solution heat treating and then precipitation heat treating the parts. A modification of this sequence is also possible in which controlled high temperature shaping of the prebonded parts is employed to improve profile and part fit up.

EXAMPLES

The effect of bonding foil chemistry and thermal treatments on the microstructure and mechanical properties were assessed experimentally. Initially, several bonding foil chemistries and thermal processes were employed to generate samples for metallographic assessment. The processes that produced the most homogeneous chemistry and microstructure across the bond line and throughout the base metal were selected for further assessment by testing the tensile and creep properties.

A CMSX-4 base material was supplied in the as-cast conditions as single crystal slabs approximately 9.5×76.2×152.4 mm (0.375×3×6 inches). The bonding media were obtained as 50 μm (0.002 inch) thick commercial bonding foils.

The boron levels of the bonding foils are actually B ranges since two of the foils were supplied in several forms with slightly different boron levels: Ni-Flex 110 was supplied with 1.3%, 1.7% and 2.5% B levels and Ni-Flex 120 was supplied with 1.5%, 1.7% and 1.9% B levels. Furthermore, it should be noted that since the foils were fabricated by a diffusion process, the boron concentration was not uniform through the depth of the foil. The boron levels quoted in the table are average concentrations over the depth of the foil.

Sample preparation for the metallographic and mechanical testing phases of the program was similar. The only differences being that larger samples were employed for the mechanical test samples and that refined surface preparation methods developed during the initial phase of the program were available for bonding the mechanical test samples. The metallographic samples' bonding surfaces were finished by low stress grinding, 120 grit, 320 grit, or 600 grit polishing, or electropolishing, whereas the bonding surfaces of the mechanical test samples were finished only by low stress grinding.

To avoid issues relating to sample misorientation, all bonding samples were prepared by cutting and rejoining individual single crystals, i.e., an original single crystal slab was sectioned perpendicular to its crystal growth direction and the surfaces so produced were rebonded after surface finishing. All of the initial cutting of the samples was performed using a metallographic silicon carbide abrasive wheel which was also used to extract the smaller metallographic samples from the width of the slab. The bonded samples for metallographic evaluation were approximately 13×13×13 mm (0.5×0.5×0.5 inch) parallelpipeds while the samples prepared for mechanical test sample fabrication were 9.5×76.2×38 mm (0.375×3×1.5 inch) i.e., full width/one quarter slab height.

Bonding was conducted in a high vacuum furnace during which time the samples were held in place by molybdenum fixturing. Prior to bonding, the foils and the single crystals were thoroughly degreased. The bonding foil was cut to exactly fit the cross-section of the bond and was fit into place between the two mating surfaces as the samples were assembled in the fixture. This fixture not only maintained alignment of the single crystals but also developed controlled loads of the order of 0.1 to 1.0 MPa (15–150 psi) across the bond line during furnace heat up and at the bonding temperature.

The CMSX-4 slabs were bonded in either the as-cast or solution treated condition. The solution treatment, which is typical for this alloy, was conducted under inert atmosphere and involved a ramped cycle up to a six hour hold at 1,593K (1,320° C., 2,408° F.). The cooling rate after solution treatment averaged approximately 433K/minute (160° C./minute, 300° F./minute). Two different bonding cycles were investigated for bonding the single crystals. Cycle A was performed at 1,543K (1,270° C., 2,318° F.) for 4 hrs while Cycle B was performed at 1,505K (1,232° C., 2,250° F.) for 4 hrs. Both bonding cycles were conducted in a vacuum of better than $1.3 \times 10^{-2}$ Pa ($1 \times 10^{-5}$ torr).

Following bonding, samples were either solution treated and then precipitation aged or simply precipitation aged. The post-bond solution treatment was identical to the pre-bond solution treatment. The precipitation age was the standard two-step heat treatment recommended for this alloy, specifically, a slow ramp to 1,413K (1,140° C., 2,084° F.) for 4 hrs and air cool followed by 1,123K (850° C., 1,562° F.) for 20–24 hrs with an air cool. The combinations of foils chemistries and thermal processing conditions that were evaluated are summarized in Table 7.

The samples listed in Table 7 were characterized using scanning electron microscopy (SEM) and energy dispersive spectroscopy (EDS) chemical analysis. Additional microstructural work, including light optical micropy, electron probe micro-analysis, and scanning transmission electron microscopy (STEM), was performed on selected samples. Samples were examined after bonding and, where applicable, after post bond solution treating, to assess the ceical uniformity across the bond region. The samples were subsequently examined after precipitation aging to determine the form and uniformity of the γ' structure.

All of the conditions listed in Table 7 induced reasonably uniform chemistries across the bond line and generated high volume fractions of γ' within the bond region. Differences were observed in the specific γ' volume fraction and, particularly, in the γ' morphology as a function of thermal processing and bond composition. The optimum structure, which was equivalent to the optimally heat treated base alloy, was generated in sample I using foil Ni-Flex 110 with 1.3% B, the lower bonding temperature of 1,505K (1,232° C., 2,250° F.), and subsequent solution treating and precipitation aging.

When the higher bonding temperature cycle was employed with the increased boron levels, excessive bond fluidity, manifested by liquid run-out down the side of the samples was observed. Excessive bond fluidity is not desired in joining precision structures. Lower boron contents and lower bonding temperatures would avoid excessive fluidity and if they can produce good bond region structures, should be preferred choices of bonding systems.

TABLE 7

Bonding Foil Chemistries and Thermal Processing/Surface Preparation Combinations

| Sample Name | Foil Name | Foil B Content, wt. % | Pre-Bond Thermal Conditions | Bonding Cycle | Post-Bond Thermal Processing |
|---|---|---|---|---|---|
| A | Ni-Flex 110 | 2.5 | As-Cast | A | Solution + Precip. |
| B | Ni-Flex 110 | 2.5 | Solution | A | Solution + Precip. |
| C | Ni-Flex 110 | 2.5 | Solution | B | Solution + Precip. |
| D | Ni-Flex 115 | 3.0 | As-Cast | A | Solution + Precip. |
| E | Ni-Flex 115 | 3.0 | Solution | A | Solution + Precip. |
| F | Ni-Flex 110 | 1.7 | As-Cast/ 120 polish | A | Solution + Precip. |
| G | Ni-Flex 120 | 1.7 | As-Cast/ 320 polish | A | Solution + Precip. |
| H | Ni-Flex 110 | 1.3 | As-Cast/ 600 polish | A | Solution + Precip. |
| I | Ni-Flex 110 | 1.3 | As-Cast | B | Solution + Precip. |
| J | Ni-Flex 110 | 1.3 | Solution | A | Solution + Precip. |
| K | Ni-Flex 110 | 1.3 | Solution | A | Solution + Precip. |

TABLE 7-continued

Bonding Foil Chemistries and Thermal Processing/
Surface Preparation Combinations

| Sample Name | Foil Name | Foil B Content, wt. % | Pre-Bond Thermal Conditions | Bonding Cycle | Post-Bond Thermal Processing |
|---|---|---|---|---|---|
| L | Ni-Flex 110 | 1.3 | Solution | A | Solution + Precip. |
| M | Ni-Flex 110 | 1.3 | Solution | A | Solution + Precip. |
| N | Ni-Flex 110 | 1.3 | As-Cast | B | Precip. |
| O | Ni-Flex 110 | 2.5 | Solution | B | Precip. |

Notes: Solution = solution treated; Precip. = precipitation treated

Although the foil chemistry, with respect to the major elements, appeared to have little effect on the bonded region chemistry, it did have a marked effect on the γ' morphology in the bond region. The γ' formed in the bond region of the sample fabricated with foil Ni-Flex 115 is more rounded than that formed in the bond region of the sample fabricated with foil Ni-Flex 110. The more cuboidal γ'/γ' structure is the more preferable, since it is indicative of greater anisotropy and stability under creep conditions; Ni-Flex 110 was, therefore, selected as the preferred foil bonding foil for CMSX-4. The selection of Ni-Flex 110 is not surprising since it is compositionally a better match with CMSX-4 than the Ni-Flex 115 foil.

Examination of the structures produced by different foils, different substrate conditions and different post-bond thermal processing indicates that all of these parameters affect the degree to which the bonding process dissolves the base metal and subsequently controls the chemistry and structure of the bond region. The optimum microstructure is achieved when dissolution of the base metal causes the composition of the liquid pool to be sufficient to solidify with approximately the same composition as the base material but to be insufficient to allow the formation of any eutectic γ' on final solidification at the bond line.

Excessive dissolution of the base metal causing the subsequent production of eutectic γ' at the bond line was observed in Sample C that was bonded with 2.5% boron. Even though the bonding foil contains less aluminum and titanium than the base alloy, aggressive dissolution of these elements into the bonding pool causes subsequent formation of eutectic γ'. If the eutectic particles are small, they can be dissolved by post-bonding solution treatment; it was noticed that higher boron bonds required post-bond solution treating to develop better γ' microstructures. However, because post bond solution treating cannot guarantee the dissolution of the larger eutectic particles, it appears that lower boron levels and bonding temperatures are preferable.

Conversely, when aluminum and titanium are dissolved from the base metal, the chemistry and structure of the γ' in the bond zone are modified. The consequence of this depletion is reduced γ' volume fraction and rounding of the strengthening γ' cuboids. Since Zheng has shown that more aluminum in the γ' gives rise to a more angular γ' morphology, increased dissolution of base metal aluminum should give rise to better anisotropy and creep stability. For sample I, the substrate was in the as-cast condition and for sample M the substrate was in the solution treated condition prior to bonding. Sample I displayed the preferred angular γ' morphology, presumably due to more aluminum being available for dissolution from the eutectic and interdendritic regions of the as-cast structure.

To assess the effect of surface preparation on bond quality, facing surfaces were prepared with a range of finishes, from 120 grit heavy polishing through 320 and 600 grit heavy polishing, light 600 grit polishing, low stress grinding and electropolishing. While none of the surface preparations induced recrystallization, the heavier mechanical polishes produced very small rounded γ' particles in the bond zone, whereas the optimum, large cuboidal γ' morphology was produced by light 600 grit polishing, low stress grinding and electropolishing. Electropolishing, while producing an excellent stress free smooth surface, tended to round the edges of the sample and the bonds fabricated from electropolished samples often exhibited edge notches from this effect. Since low stress grinding produced the optimum bond region and because this method of surface finishing allowed for precise machining of test blocks, it was selected as the method of mating surface preparation for the mechanical test samples.

Conditions I, N, B and O were selected for further investigation for mechanical testing. However, in this phase of the program, bond cycle B (1,505K (1,232° C., 2,250° F.) for 4 hrs) was employed for all of the samples. Combination I (low B, as-cast base material) was selected because it produced the best microstructure of the initial options. An excellent γ' morphology is induced by this process in both the base metal and in the bond region. Combination N was selected since it produced an adequate microstructure and was included to assess the potential for excluding post bond solution treatment. Combinations B and O were included to assess options that included prebond solution treatment. These samples were bonded with the higher boron containing foil since the previously completed metallographic work had indicated that presolution treated material produced better γ' morphology when bonded with higher boron foils.

Specimens for mechanical testing were prepared by bonding two quarter sections of the original cast slabs back together to form 9.5×76.2×76 mm (0.375×3×3 inch) slabs. These slabs were subsequently cut into 9.5 mm (0.375 inch) wide specimen blanks that were later machined into 0.6 mm (0.25 inch) gage diameter creep and tensile samples. The axes of the test samples were, therefore, parallel to the original growth direction of the single crystal slabs.

Tensile tests were conducted at room temperature, 1,172K (899° C., 1,650° F.) and 1,255K (982° C., 1,800° F.). The results of these tests are tabulated in Table 8. For comparison, this table also includes literature reported typical values for the tensile properties of the optimally processed CMSX-4. As Table 8 shows, all of the specimens produced strengths that were close to the values expected for good CMSX-4 single crystals. However, some of the ductility values were somewhat lower than those expected for CMSX-4. Nevertheless, the recorded values are still high compared to those of polycrystalline superalloys tested under similar conditions. Moreover, almost all of the fractures of the bonded tensile specimens occurred in the base material.

The mechanical properties demonstrated by the well bonded single crystals have been shown to be very close to those of the conventional, non-bonded, optimally heat treated single crystals. Table 8 presents some tensile property data for some of the bonded samples and compares these data to those of baseline CMSX-4.

Table 9 presents creep rupture data for the same bonding processes with the expected data for baseline CMSX-4. Creep tests were performed at 1,172K (899° C., 1,650° F.) at 50 and 80 ksi and at 1,255K (982° C., 1,800° F.) at 28 and 45Ksi, which were intended to produce creep rupture lives of about 100 and 1,000 hrs at each temperature. For completeness, base alloy samples taken from some of the original single crystal slabs were also tested.

TABLE 8

Tensile Properties of Bonded CMSX-4

| Sample Name | Processing | Failure Location | Yield Strength (ksi) | UTS (ksi) | % Elongation | % R.A. |
|---|---|---|---|---|---|---|
| | | Tensile Test Results CMSX-4 | | | | |
| | Database Typical | Base Metal | 130 | 15 | 14 | 18 |
| C | 110 2.5B S/B/S + P | Base Metal | 140 | 152 | 13.5 | 16.1 |
| N | 110 1.3B A-C/B/P | Base Metal | 117, 118 | 142, 157 | 14.5, 25.4 | 15.4, 24.4 |
| O | 110 2.5B S/B/P | Base Metal | 111 | 122 | 14.7 | 17.1 |
| I | 110 1.3B A-C/B/S + P | Base Metal | N/R | 137 | 2.6 | 6.4 |
| | Acceptance Criteria | Base Metal | 115 | 123 | NA | NA |
| | Database Typical | Base Metal | 110 | 150 | 18 | 37 |
| C | 110 2.5B S/B/S + P | Base Metal | 114 | 140 | 3.4 | 5.9 |
| N | 110 1.3B A-C/B/P | Bond | 100.99 | 128, 128 | 13.7, 16.5 | 19.6, 24.3 |
| O | 110 2.5B S/B/P | Base Metal | 105, 106 | 130, 131 | 22.9, 18.5 | 34.5, 28.4 |
| I | 110 1.3B AC/B/S + P | Base Metal | 106 | 106 | 1.1 | 2.6 |
| | Acceptance Criteria | Base Metal | 95 | 130 | NA | NA |
| | Database Typical | Base Metal | 95 | 125 | 18 | 45 |
| C | 110 2.5B S/B/S + P | Base Metal | 102 | 117 | 4.1 | 6.9 |
| N | 110 1.3B AC/B/P | Bond | 74, 83 | 103, 99 | 10.4, 8.1 | 16.8, 17.8 |
| O | 110 2.5B S/B/P | Base Metal | 90, 82 | 101, 104 | 19.3, 19.5 | 26.3, 37.2 |
| I | 110 1.3B A-C/B/S + P | Base Metal | 110, 61 | 119, 61 | 13.6, 4.6 | 21.4, 7.9 |
| | Acceptance Criteria | Base Metal | 78 | 110 | NA | NA |
| | | CM247LC/MAR-M247 | | | | |
| | Database Typical | Base Metal | 116 | 139 | 7.5 | 11 |
| | 115 3B A-C/B/P | Base Metal | 129 | 141 | 8.5 | 9.1 |
| | 115 3B A-C/B | Base Metal | 111 | 137 | 10.1 | 17.2 |
| | Acceptance Criteria | Base Metal | 94 | 126 | 6 | 7 |
| | Database Typical | Base Metal | 105 | 132 | 9 | 11 |
| | 115 3B A-C/B/P | Bond | 89 | 109 | 1.1 | 1.8 |
| | 115 3B A-C/B | Bond | 80 | 110 | 2.3 | 4.9 |
| | Acceptance Criteria | Base Metal | 75 | 105 | 7.5 | 8 |
| | Database Typical | Base Metal | 50 | 80 | 14 | 19 |
| | 115 3B A-C/B/P | Bond | 54 | 67 | 1.5 | 1.8 |
| | 115 3B A-C/B | Bond | 52 | 70 | 0.4 | 1.1 |
| | Acceptance Criteria | Base Metal | 30 | 65 | 12 | 15 |

TABLE 9

Creep Test Results CMSX-4

| Sample Name | Temperature | Stress (ksi) | Processing | Failure Location | Rupture Time (hours) | % Elongation | % R.A. |
|---|---|---|---|---|---|---|---|
| | 1650 F. | 50 | Database Typical | Base Metal | ~1000 | NA | NA |
| C | 1650 F. | 50 | 110 2.5B S/B/S + P | Bond | 872.7 | 18.5 | 23.7 |
| N | 1650 F. | 50 | 110 1.3B A-C/B/P | Bond | 342.5 | 11.4 | 17.8 |
| O | 1650 F. | 50 | 110 2.5B S/B/P | Bond | 393.1 | 6.4 | 8.3 |
| I | 1650 F. | 50 | 110 1.3B A-C/B/S + P | Bond | 1125.4, 405 | 11.2, 3.1 | 18.7, 9.4 |
| | 1650 F. | 50 | No Bond, Base Alloy | Base Metal | 893 | 33.6 | 34.9 |
| | 1650 F. | 80 | Database Typical | Base Metal | 30–100 | NA | NA |
| C | 1650 F. | 80 | 110 2.5B S/B/S + P | Bond | 67.6 | 13.8 | 18.4 |
| N | 1650 F. | 80 | 110 1.3B A-C/B/P | Bond | 11.5 | 7.6 | 17 |
| O | 1650 F. | 80 | 110 2.5B S/B/P | Bond | 19.8 | 16.7 | 20.2 |
| I | 1650 F. | 80 | 110 1.3B A-C/B/S + P | Base Metal, Bond | 16.7, 59.6 | 5.1, 10.6 | 5.3, 21.2 |
| | 1650 F. | 80 | No Bond, Base Alloy | Base Metal | 7.8 | 15.1 | 23.8 |
| | 1800 F. | 28 | Database Typical | Base Metal | ~1000 | NA | NA |
| C | 1800 F. | 28 | 110 2.5B S/B/S + P | Bond | 793.6 | 23.5 | 24 |
| N | 1800 F. | 28 | 110 1.3B A-C/B/P | Bond | 235.5 | 6.7 | 10.8 |
| O | 1800 F. | 28 | 110 2.5B S/B/P | Bond | 187.9 | 2.6 | 3.9 |
| I | 1800 F. | 28 | 110 1.3B A-C/B/S + P | Bond, Bond | 784.4, 838 | 15.3, 17.1 | 15.4, 18.5 |
| | 1800 F. | 28 | No Bond, Base Alloy | Base Metal | 384 | 24.3 | 27.6 |
| | 1800 F. | 45 | Database Typical | Base Metal | ~100 | NA | NA |
| C | 1800 F. | 45 | 110 2.5B S/B/S + P | Bond, Bond | 97.8, 102.8 | 20.2, 25.6 | 26.3, 27.8 |
| N | 1800 F. | 45 | 110 1.3B A-C/B/P | Bond | 6 | 2.5 | 6.2 |
| O | 1800 F. | 45 | 110 2.5B S/B/P | Bond | 21.2 | 11.3 | 24.6 |
| I | 1800 F. | 45 | 110 1.3B A-C/B/S + P | Bond, Bond, Base Metal | 32.1, 78.1, 81.3 | 3.9, 17.8, 11.8 | 9.8, 23.5, 16.3 |
| | 1800 F. | 45 | No Bond, Base Alloy | Base Metal | 75.6 | 27.6 | 28 |

The properties presented in Tables 8 and 9 reflect the properties of bonded single crystals in which the two proportions of the crystal are well aligned and the axis of testing is very close to the <001> orientation, which is the strongest testing direction in nickel base single crystals. The properties of a bonded single crystal are expected to display the same orientation dependence as those of an unbonded single crystal. Because the microstructure is continuous across the original interface, no excessive plane of weakness is presented by the bond region misorientation of the mechanical test axis away from the normal to the bond line, and should not lead to any deviation from the behavior of conventional single crystals when the two bonded portions share the same crystallographic orientation.

A different situation exists when the two crystal portions are not of the identical orientation. In this case, the misorientation between the two crystal structures causes a formation of a grain boundary structure between the two portions after bonding. In single crystals at high temperatures, grain boundaries are known to be sources of weakness and sites for premature failure. With nickel base superalloys material properties are degraded as the misorientation of the boundary increases.

The present bonding process allows the presence of grain boundaries of up to about 10 degrees, although 15° to 20° misorientations may be allowable in some cases. Since the presence of a high misorientation does not affect the structure of the grain boundary that is formed on bonding, the properties of a bonded grain boundary will be identical to those of a grain boundary that is formed in a conventional casting. Thus, the allowable mismatch across a bonded grain boundary should be identical to that allowed for a cast grain boundary, for example, 10°, 15° or 20° depending upon the acceptance criteria. In order to assure processability by bonding the crystallographic orientations of the parts to be bonded should lie within these limits.

In contrast to the tensile fractures, the creep fractures tended to occur within the bond regions. Nevertheless, the creep rupture lives were not only very close to the expected lives for CMSX-4, but in several cases exceeded the lives of unbonded single crystal sample taken from the same casting batch. The localization of the fractures within the bond zones was, however, manifested by the reduced ductilities of the bonded samples which were always lower than those of the unbonded samples. In the absence of any microstructural gradient across the bond zone, the reason for this constrain is not readily apparent. Since the creep rupture ductility values displayed by the best performing samples were always in the range of 10 to 20 percent, the bonded structure appears to have more than sufficient strength and ductility for service.

The strength and ductility values of the creep and tensile tests support the selections of the bond foils and thermal processing conditions for bonding of single crystal CMSX-4. The mechanical properties developed indicate that bonded CMSX-4 single crystals display a significant fraction (at least about 90 percent) of the thermal and mechanical properties exhibited by pure single crystal CMSX-4. Comparing these properties with those required to support the design designated loads across the potential bond planes for fabricated blades indicates that the bonded joint region should not be a source of weakness or vulnerability in fabricated blades.

Whereas particular embodiments of this invention have been described above for purposes of illustration, it will be evident to those skilled in the art that numerous variations of this details of the present invention may be made without departing from the invention as defined in the appended claims.

What is claimed is:

1. A method of manufacturing a turbine blade for a land based turbine comprising the steps of:
    selecting a single crystal superalloy for forming the turbine blade;
    selecting a plurality of segments of the turbine blade to be formed by a plurality of individual castings of the superalloy, the location of the segments being selected to place joints between adjacent segments at locations of reduced stress;
    forming the segments by casting the superalloy in a plurality of molds;
    joining the segments by transient liquid phase bonding; and
    precipitation heat treating the bonded segments.

2. The method of claim 1, further comprising locating the segments so that transverse stress across bond surface is less than about 30 percent of the strength of the superalloy.

3. The method of claim 1, further comprising locating the segments so that transverse stress across a bond surface is less than the strength of the bond created during the joining step, where the segments are curved segments and where said location of reduced stress is determined by a design segmentation process which identifies slowly curving surfaces that will be at positions of reduced stress.

4. The method of claim 1, further comprising solution heat treating the bonded segments before the precipitation heat treatment.

5. The method of claim 1, wherein the single crystal superalloy is nickel based.

6. The method of claim 5, wherein the single crystal nickel base superalloy comprises about 6.6 weight percent Cr, about 9.6 weight percent Co, about 5.5 weight percent Al, about 1 weight percent Ti, about 0.6 weight percent Mo, about 6.5 weight percent Ta, about 6.4 weight percent W, about 3 weight percent Re, about 0.9 weight percent Hf, and the balance Ni.

7. The method of claim 1, further comprising joining at least one segment of a polycrystalline superalloy to the single crystal superalloy segments.

8. The method of claim 7, wherein the polycrystalline superalloy is nickel based.

9. The method of claim 8, wherein the polycrystalline nickel base superalloy comprises about 8.1 weight percent Cr, 9.2 weight percent Co, 5.6 weight percent Al, 0.7 weight percent Ti, 0.5 weight percent Mo, 3.2 weight percent Ta, 9.5 weight percent W, 1.4 weight percent Hf, 0.015 weight percent Zr, 0.015 weight percent B, 0.07 weight percent C, and the balance Ni.

10. The method of claim 1, wherein the turbine blade has a total length of at least 12 inches, an airfoil chord of at least 4 inches and an airfoil thickness of at least 5/16 inch.

11. The method of claim 1, wherein the selecting of the plurality of segments to be formed is such that the required strength at the locations of reduced stress is less than about 80 percent of the parent metal using finite element analysis to determine that stresses at all bonding points are well below the performance limits of the material of the segments, and as a last step the precipitation heat treated segments are age heat treated at a temperature below the precipitation heat treatment.

12. A turbine blade for a land based turbine comprising multiple segments of individually cast single crystal superalloys bonded together with joints located at positions of reduced stress, said turbine blade having root and airfoil portions, wherein the airfoil portions comprises at least two segments of a single crystal superalloy, the location of the segments being selected to place joints between adjacent segments at locations of reduced stress.

13. The turbine blade of claim 12, wherein the turbine blade comprises three of the segments.

14. The turbine blade of claim 12, wherein the turbine blade comprises four of the segments.

15. The turbine blade of claim 12, wherein the single crystal superalloy is nickel based.

16. The turbine blade of claim 15, wherein the single crystal nickel base superalloy comprises about 6.6 weight percent Cr, about 9.6 weight percent Co, about 5.5 weight percent Al, about 1 weight percent Ti, about 0.6 weight percent Mo, about 6.5 weight percent Ta, about 6.4 weight percent W, about 3 weight percent Re, about 0.9 weight percent Hf, and the balance Ni.

17. The turbine blade of claim 12, wherein a root portion of the turbine blade comprises at least one segment of a polycrystalline superalloy, where the airfoil portions are curved and where the positions of reduced stress are determined by a design segmentation process which identifies slowly curving surfaces that will be at positions of reduced stress.

18. The turbine blade of claim 17, wherein the polycrystalline superalloy comprises about 8.1 weight percent Cr, 9.2 weight percent Co, 5.6 weight percent Al, 0.7 weight percent Ti, 0.5 weight percent Mo, 3.2 weight percent Ta, 9.5 weight percent W, 1.4 weight percent Hf, 0.015 weight percent Zr, 0.015 weight percent B, 0.07 weight percent C, and the balance Ni.

19. The turbine blade of claim 12, wherein the turbine blade has a total length of at least 12 inches, an airfoil chord of at least 4 inches and an airfoil thickness of at least $5/16$ inch.

20. If The turbine blade of claim 12, wherein the location of reduced stress is such that the required strength at that location is less than about 80 percent of the parent metal using finite element analysis to determine that stresses at all bonding points are well below the performance limits of the material of the segments.

* * * * *